(12) United States Patent
Lee et al.

(10) Patent No.: US 9,030,110 B2
(45) Date of Patent: May 12, 2015

(54) LIGHT EMITTING DEVICE FOR AC POWER OPERATION

(75) Inventors: Chung Hoon Lee, Gwangmyeong-si (KR); James S. Speck, Santa Barbara, CA (US); Hong San Kim, Seongnam-si (KR); Jae Jo Kim, Uiwang-si (KR); Sung Han Kim, Suwon-si (KR); Jae Ho Lee, Yongin-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 600 days.

(21) Appl. No.: 12/837,805
(22) Filed: Jul. 16, 2010
(65) Prior Publication Data

US 2010/0277084 A1      Nov. 4, 2010

Related U.S. Application Data

(63) Continuation of application No. 11/994,308, filed as application No. PCT/KR2006/001726 on May 9, 2006.

(30) Foreign Application Priority Data

| Jun. 28, 2005 | (KR) | 10-2005-0056175 |
| Nov. 3, 2005 | (KR) | 10-2005-0104952 |
| Dec. 21, 2005 | (KR) | 10-2005-0126872 |
| Dec. 21, 2005 | (KR) | 10-2005-0126873 |
| Dec. 21, 2005 | (KR) | 10-2005-0126904 |
| Feb. 11, 2006 | (KR) | 10-2006-0013322 |

(51) Int. Cl.
   *H05B 37/00*     (2006.01)
   *H05B 33/08*     (2006.01)
   (Continued)

(52) U.S. Cl.
   CPC .......... *H05B 33/083* (2013.01); *H05B 33/0806* (2013.01); *H05B 33/0824* (2013.01); *H05B 33/02* (2013.01); *H01L 27/156* (2013.01); *H05B 33/0821* (2013.01); *H01L 27/153* (2013.01)

(58) Field of Classification Search
   USPC ...... 315/185 R, 186, 192, 193, 185 S, 200 R, 315/201, 203, 200 A, 209 R, 210, 226, 294, 315/295, 312, 313, 317, 320, 323, 360, 315/362; 362/217, 219, 221, 222, 223, 227, 362/249, 251, 252, 362, 363, 375, 800, 806, 362/812
   See application file for complete search history.

(56) References Cited

U.S. PATENT DOCUMENTS

| 4,271,408 A | 6/1981 | Teshima et al. |
| 4,298,869 A * | 11/1981 | Okuno ............................ 345/82 |

(Continued)

FOREIGN PATENT DOCUMENTS

| CN | 1289456 | 3/2001 |
| CN | 1349261 | 5/2002 |

(Continued)

OTHER PUBLICATIONS

Extended European Search Report of EP 06757670.2 dated on May 10, 2010.

(Continued)

*Primary Examiner* — Douglas W Owens
*Assistant Examiner* — Jianzi Chen
(74) *Attorney, Agent, or Firm* — H.C. Park & Associates, PLC

(57) ABSTRACT

Disclosed is an improved light-emitting device for an AC power operation. A conventional light emitting device employs an AC light-emitting diode having arrays of light emitting cells connected in reverse parallel. The arrays in the prior art alternately repeat on/off in response to a phase change of an AC power source, resulting in short light emission time during a ½ cycle and the occurrence of a flicker effect. An AC light-emitting device according to the present invention employs a variety of means by which light emission time is prolonged during a ½ cycle in response to a phase change of an AC power source and a flicker effect can be reduced. For example, the means may be switching blocks respectively connected to nodes between the light emitting cells, switching blocks connected to a plurality of arrays, or a delay phosphor. Further, there is provided an AC light-emitting device, wherein a plurality of arrays having the different numbers of light emitting cells are employed to increase light emission time and to reduce a flicker effect.

12 Claims, 14 Drawing Sheets

(51) Int. Cl.
*H05B 33/02* (2006.01)
*H01L 27/15* (2006.01)

(56) References Cited

U.S. PATENT DOCUMENTS

| | | | |
|---|---|---|---|
| 5,663,719 | A | 9/1997 | Deese et al. |
| 5,770,111 | A | 6/1998 | Moriyama et al. |
| 5,808,592 | A | 9/1998 | Mizutani et al. |
| 5,839,718 | A | 11/1998 | Hase et al. |
| 5,885,483 | A | 3/1999 | Hao et al. |
| 5,936,599 | A | 8/1999 | Reymond |
| 5,998,925 | A | 12/1999 | Shimizu et al. |
| 6,084,250 | A | 7/2000 | Justel et al. |
| 6,093,346 | A | 7/2000 | Xiao et al. |
| 6,252,254 | B1 | 6/2001 | Soules et al. |
| 6,267,911 | B1 | 7/2001 | Yen et al. |
| 6,495,964 | B1 | 12/2002 | Muthu et al. |
| 6,600,175 | B1 | 7/2003 | Baretz et al. |
| 6,641,294 | B2 | 11/2003 | Lefebvre |
| 6,734,465 | B1 | 5/2004 | Taskar et al. |
| 6,841,947 | B2 | 1/2005 | Berg-johansen |
| 6,989,807 | B2 | 1/2006 | Chiang |
| 7,081,722 | B1 * | 7/2006 | Huynh et al. ............... 315/323 |
| 7,195,381 | B2 * | 3/2007 | Lynam et al. ............... 362/494 |
| 8,294,165 | B2 | 10/2012 | Hattori et al. |
| 2001/0033503 | A1 | 10/2001 | Hamp et al. |
| 2002/0043926 | A1 | 4/2002 | Takahashi et al. |
| 2002/0043943 | A1 | 4/2002 | Menzer et al. |
| 2002/0145384 | A1 | 10/2002 | Jeganathan et al. |
| 2003/0001807 | A1 | 1/2003 | Debiez et al. |
| 2004/0075399 | A1 | 4/2004 | Hall |
| 2004/0124422 | A1 | 7/2004 | Sakamoto et al. |
| 2004/0195576 | A1 * | 10/2004 | Watanabe et al. ............ 257/79 |
| 2004/0206970 | A1 | 10/2004 | Martin |
| 2005/0047134 | A1 | 3/2005 | Mueller et al. |
| 2007/0069663 | A1 | 3/2007 | Burdalski et al. |
| 2007/0273299 | A1 | 11/2007 | Miskin et al. |
| 2009/0167192 | A1 * | 7/2009 | Diederiks et al. ............ 315/149 |

FOREIGN PATENT DOCUMENTS

| | | |
|---|---|---|
| CN | 1460294 | 12/2003 |
| DE | 38 32 109 | 3/1990 |
| EP | 0 967 590 | 12/1999 |
| EP | 1 318 701 | 6/2003 |
| JP | 200068555 | 3/2000 |
| JP | 2000-101136 | 4/2000 |
| JP | 2001156331 | 6/2001 |
| JP | 2002-016290 | 1/2002 |
| JP | 2005-072546 | 3/2005 |
| JP | 2006-147933 | 6/2006 |
| KR | 1020040032360 | 4/2004 |
| TW | 200428683 | 12/2004 |
| WO | 00/33390 | 6/2000 |
| WO | 01/97287 | 12/2001 |
| WO | 2004023568 | 3/2004 |
| WO | 2004/082032 | 9/2004 |
| WO | 2005/051054 | 6/2005 |

OTHER PUBLICATIONS

Non-Final Office Action of U.S Appl. No. 11/994,308 issued on Sep. 2, 2010.
U.S. Office Action dated Apr. 1, 2011 (from co-pending U.S. Appl. No. 11/994,308).
Non-Final Office Action of U.S. Appl. No. 12/908,692 issued on Jul. 13, 2011.
Chinese Office Action for CN Patent Application No. 201010113979.5 issued on Apr. 25, 2011.
Non-Final Office Action of U.S. Appl. No. 11/994,308 mailed on Aug. 19, 2011.
European Search Report of EP 10 17 8811.5 dated Feb. 24, 2012.
Final Office Action dated Dec. 27, 2011 for U.S. Appl. No. 12/908,692.
Non-Final Office Action issued on Feb. 7, 2012 in U.S. Appl. No. 11/994,308.
Notice of Allowance issued on Apr. 12, 2012 in U.S. Appl. No. 11/994,308.
European Search Report issued on Feb. 8, 2012 in EP 10 17 8814.
Non-Final Office Action issued on Jun. 7, 2012 in U.S. Appl. No. 13/461,505.
Notice of Allowance issued on Nov. 9, 2012 in U.S. Appl. No. 13/461,505.
The Fourth Office Action issued on Jan. 4, 2013 in Chinese Patent Application No. 201010114021.8.
Preliminary Notice of First Office Action issued on Apr. 9, 2013 in Taiwanese Patent Application No. 10220429200.
European Search Report issued on Nov. 19, 2012 in European Patent Application No. 12179804.5.
Non-Final Office Action issued on Nov. 14, 2013 in U.S. Appl. No. 13/762,932.
Non-Final office Action issued on Dec. 23, 2013 in U.S. Appl. No. 14/012,694.
Notice of Allowance issued on Jan. 31, 2014 in U.S. Appl. No. 12/908,692.
Non-Final office Action issued on Jun. 5, 2014 in U.S. Appl. No. 13/344,406.

* cited by examiner

Related Art

_US 9,030,110 B2_

LIGHT EMITTING DEVICE FOR AC POWER OPERATION

CROSS-REFERENCE TO RELATED APPLICATIONS

This application is a continuation of U.S. patent application Ser. No. 11/994,308, filed on Dec. 28, 2007, which is the U.S. national stage entry of International Application No. PCT/KR2006/001726, filed on May 9, 2006, and claims priority from and the benefit of Korean Patent Application No. 10-2005-0056175, filed on Jun. 28, 2005, Korean Patent Application No. 10-2005-0104952, filed on Nov. 3, 2005, Korean Patent Application No. 10-2005-0126872, filed on Dec. 21, 2005, Korean Patent Application No. 10-2005-0126873, filed on Dec. 21, 2005, Korean Patent Application No. 10-2005-0126904, filed on Dec. 21, 2005, and Korean Patent Application No. 10-2006-0013322, filed on Feb. 11, 2006, which are hereby incorporated by reference for all purposes as if fully set forth herein.

BACKGROUND OF THE INVENTION

1. Field of the Invention

The present invention relates to a light emitting device, and more particularly, to a light-emitting device for an AC power operation, which has an array of light emitting cells connected in series.

2. Discussion of the Background

A light emitting diode (LED) is an electroluminescence device having a structure in which an N-type semiconductor and a P-type semiconductor are joined together, and emits light through recombination of electrons and holes. Such an LED has been widely used for a display and a backlight. Further, since the LED has less electric power consumption and a longer service life as compared with conventional light bulbs or fluorescent lamps, its application area has expanded to the use thereof for general illumination while substituting the conventional incandescent bulbs and fluorescent lamps.

The LED repeats on/off in accordance with the direction of a current under an AC power source. Thus, if the LED is used while being connected directly to the AC power source, there is a problem in that it does not continuously emit light and is easily damaged by reverse currents.

To solve such a problem of the LED, an LED that can be used while being connected directly to a high voltage AC power source is proposed in International Publication No. WO 2004/023568A1 entitled "LIGHT-EMITTING DEVICE HAVING LIGHT-EMITTING ELEMENTS" by SAKAI et al.

According to the disclosure of WO 2004/023568A1, LEDs are two-dimensionally connected in series on an insulative substrate such as a sapphire substrate to form LED arrays. Two LED arrays are connected in reverse parallel on the sapphire substrate. As a result, there is provided a single chip light emitting device that can be driven by means of an AC power supply.

FIGS. 1 and 2 are schematic circuit diagrams illustrating a conventional light emitting device having light emitting cells connected in series; FIG. 3 is a schematic graph illustrating a driving voltage and a current with time in the conventional light emitting device; and FIG. 4 is a schematic graph illustrating a driving voltage and a light emission amount of the conventional light emitting device.

Referring to FIGS. 1 and 2, light emitting cells $C_1$ to $C_n$ are connected in series to constitute an array. At least two arrays are provided within a single chip 15 in FIG. 2, and these arrays are connected in reverse parallel to each other. Meanwhile, an AC voltage power source 10 in FIG. 2 is connected to both ends of the arrays. As shown in FIG. 2, an external resistor R1 is connected between the AC power source 10 and the LED 15.

The light emitting cells $C_1$ to $C_n$ of the array are operated for a ½ cycle of the AC voltage power source and the other array connected in reverse parallel to the array is operated for the other ½ cycle thereof. Accordingly, the arrays are alternately operated by means of the AC voltage power source.

However, the light emitting cells connected in series are simultaneously turned on or off by mean of an AC voltage. Thus, when the AC voltage has a value larger than the sum of threshold voltages of the light emitting cells, a current begins to flow through the light emitting cells. That is, the light emitting cells simultaneously begin to be turned on when the AC voltage exceeds the sum of the threshold voltages, and they are simultaneously turned off in a case where the AC voltage is less than the sum of the threshold voltages.

Referring to FIG. 3, before an AC voltage exceeds a predetermined value, the light emitting cells are not turned on and a current does not flow therethrough. Meanwhile, when a certain period of time lapses and the AC voltage exceeds the predetermined value, a current is begins to flow through the array of the light emitting cells. Meanwhile, when the time is at T/4 while the AC voltage is more increased, the current has a maximum value and is then decreased. On the other hand, if the AC voltage is less than the predetermined value, the light emitting cells are turned off and a current does not flow therethrough. Thus, a time during which a current flows through the light emitting cells is relatively shorter than T/2.

Referring to FIGS. 4 (a) and (b), the light emitting cells emit light when a predetermined current flows through them. Thus, an effective time during which the light emitting cells are driven to emit light becomes shorter than a time during which a current flows through the light emitting cells.

As the effective time during which light is emitted becomes short, light output is decreased. And thus, a high peak value of a driving voltage may be needed to increase the effective time. However, in this case, power consumption in the external resistor R1 is increased, and a current is also increased according to the increase in the driving voltage. The increase in a current leads to increase in the junction temperature of the light emitting cells, and the increase in the junction temperature reduces the light emitting efficiency of the light emitting cells.

Further, since the light emitting cells are operated only when the voltage of the AC power source exceeds the sum of the threshold voltages of the light emitting cells within the array, the light emitting cells are operated in a rate slower than a phase change rate of the AC power source. Accordingly, uniform light is not continuously emitted on a substrate and a flicker effect occurs. Such a flicker effect remarkably appears when an object moving at a certain distance from a light source is viewed. Even though the effect is not observed with the naked eye, it may cause eye fatigue if the light emitting cells are used for illumination for a long is period of time.

SUMMARY OF THE INVENTION

An object of the present invention is to provide a light-emitting device for an AC power operation, wherein a flicker effect can be prevented or reduced, and a time during which light is emitted is increased corresponding to a phase change in an AC voltage.

Another object of the present invention is to provide a light emitting device, wherein an operation can be made with a lower current as compared with a prior art, thereby improving light emitting efficiency.

To achieve these objects, the present invention provides a light-emitting device for an AC power operation, the device having an array of light emitting cells connected in series. An aspect of the present invention provides a light emitting device, wherein light emitting cells within arrays are sequentially turned on and off. The light emitting device according to the aspect of the present invention comprises a light emitting diode (LED) chip having an array of light emitting cells connected in series; and switching blocks respectively connected to nodes between the light emitting cells. The light emitting cells are sequentially turned on and off by the switching blocks when the array is connected to and driven by an AC voltage power source. Since the light emitting cells are sequentially turned on and off, an effective time during which the light emitting cells emit light can be increased as whole.

The switching blocks may be connected to source and ground terminals of the array. At this time, an n-th switching block may short the ground terminal and a node to which the n-th switching block is connected when a voltage difference $V_{ac}$ between the source and ground terminals is in a range of (Predetermined Voltage×n) to (Predetermined Voltage×(n+1)), and may open the node from the ground terminal if the voltage difference $V_{ac}$ is greater than (Predetermined Voltage×(n+1)). Accordingly, when an AC voltage is increased, the switching blocks sequentially repeat the short-circuiting and the opening so that the light emitting cells can be sequentially turned on. When the AC voltage is decreased, the light emitting cells are sequentially turned off.

The predetermined voltage may be a forward voltage of the light emitting cells at a reference current. Accordingly, a current flowing through the light emitting cells can be constantly maintained to be a current approximate to the reference current. Thus, the light emitting efficiency of the light emitting cells can be improved by adjusting the reference current. For example, the reference current may be 15 to 25 mA.

The light emitting cells may be turned off in an order reverse to the order in which the light emitting cells are turned on. Alternatively, they may be turned off in the order in which the light emitting cells are turned on.

Each of the light emitting cells may comprise an N-type semiconductor layer, a P-type semiconductor layer and an active layer interposed therebetween. Further, the semiconductor layers may be made of a GaN based semiconductor.

Meanwhile, the LED chip may further comprise another array of light emitting cells connected in series, in addition to the array of the light emitting cells connected in series. These arrays are connected in reverse parallel to each other. Switching blocks may be connected to nodes of the light emitting cells within the other array of the light emitting cells connected in series, respectively. At this time, the switching blocks connected to nodes of the light emitting cells within the array of the light emitting cells connected in series may be connected to the nodes of the light emitting cells within the other array, respectively.

Another aspect of the present invention provides a light-emitting device for an AC power operation, the device comprising a plurality of arrays that have different numbers of light emitting cells connected in series and are connected in parallel to one another. The AC light-emitting device according to this aspect of the present invention includes a substrate. A plurality of first arrays are positioned on the substrate. The first arrays have the different numbers of light emitting cells connected in series and are connected in reverse parallel to one another. Further, a plurality of second arrays are positioned on the substrate. The second arrays have the different numbers of light emitting cells connected in series and are connected in reverse parallel to the first arrays. Accordingly, it is possible to provide an AC light-emitting device, wherein the arrays are sequentially turned on and then turned off in reverse order under an AC power source so that a flicker effect can be reduced and light emission time can be increased.

In some embodiments, the light emitting device may further comprise a switching block for controlling light emission of each of the plurality of first and second arrays depending on a voltage level of an AC power source. The switching block selectively controls the light emission of the arrays depending on the voltage level of the AC power source. At this time, one terminal of each of the first and second arrays is connected in common to a first power source connection terminal, and the other terminals thereof are connected to second power source connection terminals, respectively. In addition, the switching block may be connected between the second power source connection terminals and the AC power source to form a current path depending on the voltage level of the AC power source, thereby controlling the light emission of the arrays.

In some embodiments, each of the second arrays may have the same number of light emitting cells as each of the corresponding arrays in the first arrays. Thus, it is possible to provide a light emitting device having identical light output and light emitting spectrum according to a phase change in an AC power source. Further, an array having the greater number of the light emitting cells in the first and second arrays may have larger light emitting cells.

In some embodiments, first resistors may be respectively connected in series to the first arrays. Moreover, second resistors may be respectively connected in series to the second arrays. The first and second resistors are employed to prevent an excessive current from flowing into the first and second arrays.

The first resistors may have different resistance values, and the second resistors may also have different resistance values. The first and second resistors may be respectively connected in series to the first and second arrays in such a manner that a resistor with a larger resistance value is connected to an array having the smaller number of the light emitting cells. Accordingly, an excessive current can be prevented from flowing in an array that has been first turned on.

Meanwhile, the second resistors may have resistance values corresponding to those of the first resistors. Accordingly, it is possible to provide a light emitting device having identical light output and light emitting spectrum in relation with a phase change in an AC power source.

Instead of the first and second resistors, a common resistor may be serially connected in common to the first and second arrays. Accordingly, the arrays are sequentially operated due to differences in the numbers of the light emitting cells. Since the common resistor is connected to the respective arrays, a process of connecting a resistor is simplified.

The resistors or common resistor may be positioned on the substrate or outside the substrate. That is, the resistors or common resistor may be formed inside an LED chip, or alternatively may be formed in an additional resistor device that in turn is connected to the arrays.

Meanwhile, in each of the first and second arrays, light emitting cells within an array having the smallest number of the light emitting cells may have luminous intensity larger than that of light emitting cells within an array having the greatest number of the light emitting cells. Accordingly, it is possible to provide an AC light-emitting device, wherein the arrays are sequentially turned on and then turned off in reverse order under an AC power source so that light emission time can be increased, and arrays which are initially turned on have larger luminous intensity so that a flicker effect can be reduced.

The light emitting cells within the array having the smallest number of the light emitting cells may have roughened surfaces so that they can have luminous intensity larger than that of the light emitting cells within the array having the greatest number of the light emitting cells. The roughened surfaces of the light emitting cells prevent total reflection due to difference in refraction index, thereby improving the extraction efficiency of light emitted to the outside. Accordingly, the luminous intensity of the light emitting cell is increased.

The light emitting cells with the roughened surfaces may constitute arrays of which the number is ½ of the number of the arrays in each of the first and second arrays. In this case, the arrays of the light emitting cells with the roughened surfaces have the relatively smaller number of the light emitting cells. Meanwhile, the arrays of the light emitting cells with the roughened surfaces may be limited to arrays having the smallest number of the light emitting cells in each of the first and second arrays.

Meanwhile, the light emitting cells within the array having the smallest number of the light emitting cells may have inclined side surfaces so that they can have luminous intensity larger than that of the light emitting cells within the array having the greatest number of the light emitting cells. The inclined side surfaces improve light extraction efficiency to increase the luminous intensity of the light emitting cells.

The light emitting cells with the inclined side surfaces may constitute arrays of which the number is ½ of the number of the arrays in each of the first and second arrays. In this case, the arrays of the light emitting cells with the inclined side surfaces are have the relatively smaller number of the light emitting cells. Meanwhile, the arrays of the light emitting cells with the inclined side surfaces may be limited to arrays having the smallest number of the light emitting cells in each of the first and second arrays.

A further aspect of the present invention provides a light emitting device for an AC power operation, the device comprising a bridge rectifier.

The AC light-emitting device according to this aspect includes a substrate. A plurality of arrays are positioned on the substrate. The plurality of arrays have different numbers of light emitting cells connected in series and are connected in parallel to one another. In addition, a bridge rectifier is connected to the plurality of arrays. Two nodes of the bridge rectifier are connected to both end portions of the arrays, respectively. Accordingly, it is possible to provide an AC light emitting device, wherein the arrays are driven by means of a current rectified by the bridge rectifier, and it is also possible to provide a light emitting device, wherein the arrays are repeatedly turned on in sequence and then turned off in reverse order due to difference in the numbers of the light emitting cells.

The bridge rectifier may be positioned on the substrate. Accordingly, the bridge rectifier may be formed together with the light emitting cells. On the contrary, a bridge rectifier may be separately provided and then connected to the arrays.

In some embodiments, a switching block may be connected between one end portions of the arrays and one of the nodes of the bridge rectifier. The switching block controls light emission of each of the plurality of the arrays depending on a voltage level of an AC power source.

In some embodiments, resistors may be positioned between the bridge rectifier and the plurality of the arrays and connected in series to the plurality of the arrays, respectively. The resistors prevent an excessive current from flowing into the arrays.

The resistors may have different resistance values. At this time, the resistors are respectively connected in series to the plurality of arrays in such a manner that a resistor with a larger resistance value is connected to an array having the smaller number of the light emitting cells. Accordingly, an excessive current can be prevented from flowing in an array that has been first turned on.

Instead of the plurality of resistors, a common resistor may be serially connected in common to the plurality of arrays. If the common resistor is employed, a process of connecting a resistor can be simplified.

Meanwhile, an array having the greater number of the light emitting cells in the plurality of arrays may have larger light emitting cells.

In some embodiments, in the plurality of arrays, light emitting cells within an array having the smallest number of the light emitting cells may have luminous intensity larger than that of light emitting cells within an array having the greatest number of the light emitting cells. For example, the light emitting cells within the array having the smallest number of the light emitting cells may have roughened surfaces so that they can have luminous intensity larger than that of the light emitting cells within the array having the greatest number of the light emitting cells. Alternatively, the light emitting cells within the array having the smallest number of the light emitting cells may have inclined side surfaces so that they can have luminous intensity larger than that of the light emitting cells within the array having the greatest number of the light emitting cells.

A still further aspect of the present invention provides an AC light-emitting device comprising a delay phosphor. The AC light-emitting device according to this aspect comprises an LED chip having a plurality of light emitting cells; a transparent member for covering the LED chip; and a delay phosphor excited by light emitted from the light emitting cells to emit light in a visible light range.

Here, the term "delay phosphor" is also referred to as a long afterglow phosphor, and means a phosphor having a long decay time after an excitation light source is blocked. Here, the decay time is defined as a time taken to reach 10% of an initial value after the excitation light source has been blocked. In this embodiment, the delay phosphor may have a decay time of 1 msec or more, preferably about 8 msec or more. Meanwhile, although an upper limit of the decay time of the delay phosphor is not limited to specific values, it may be preferred that it be not too long according to uses of light emitting devices. For example, in case of a light emitting device used for general household illumination, the decay time of the delay phosphor is preferably a few minutes or less. The decay time is sufficiently 10 hours or less even for interior illumination.

According to this embodiment, when an LED chip emits visible light, the light emitted from the LED chip and light emitted from the delay phosphor are mixed to increase the light emission time of the light emitting device, thereby preventing a flicker effect of an AC light-emitting device.

The delay phosphor may be positioned between the LED chip and the transparent member, or dispersed within the transparent member.

The delay phosphor may be one of red, green and blue phosphors, or a combination thereof.

In addition to the delay phosphor, the AC light-emitting device may further comprise another phosphor excited by light emitted from the LED chip to emit light in a visible light range. Such a phosphor is employed to provide light emitting devices capable of emitting light having various colors by converting the wavelength of light emitted from the LED chip. For example, in a case where the LED chip emits ultraviolet light, the other phosphors may be red, green and/or blue phosphors to emit white light through mixing with light in a visible light range emitted from the delay phosphor. Further, in a case where the LED chip emits blue light, the other phosphors may be a red phosphor and/or a green phosphor, or a yellow phosphor.

According to the present invention, it is possible to provide a light emitting device for an AC power operation, wherein a flicker effect can be prevented or reduced and a time during which light is emitted is increased corresponding to a phase change in an AC voltage. Further, it is possible to provide a light emitting device, wherein an operation can be made with a lower current as compared with a prior art, thereby improving light emitting efficiency.

DETAILED DESCRIPTION OF THE ILLUSTRATED EMBODIMENTS

Figure 1:
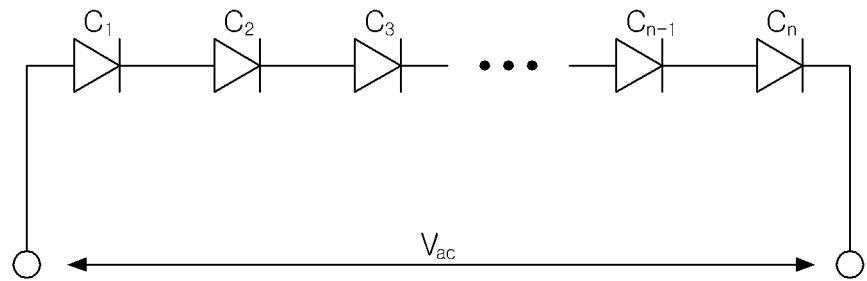
FIGS. 1 and 2 are schematic circuit diagrams illustrating a conventional AC light-emitting device.
Figure 2:
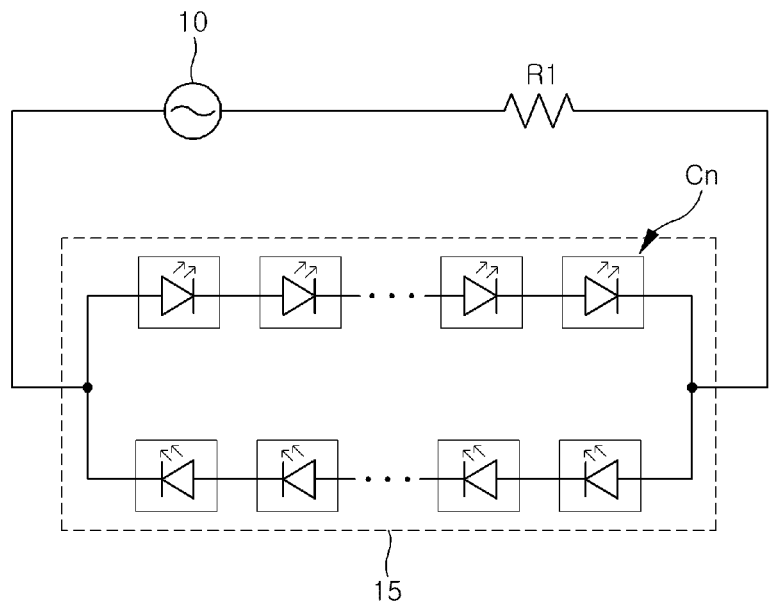
Figure 3:
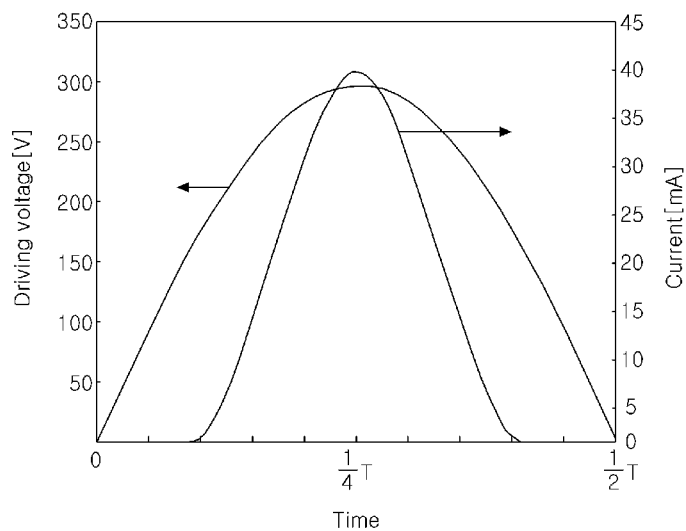
FIG. 3 is a schematic graph illustrating a driving voltage and a current with time in the conventional AC light-emitting device.
Figure 4:
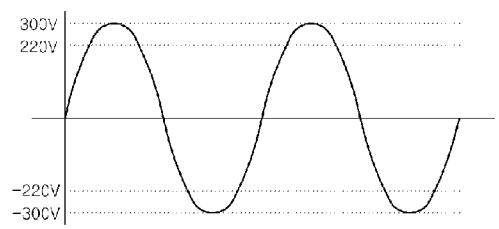
FIG. 4 is a schematic graph illustrating a driving voltage and a light emission amount of the conventional AC light-emitting device.
Figure 4:
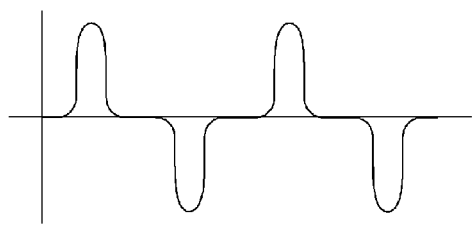

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 5:
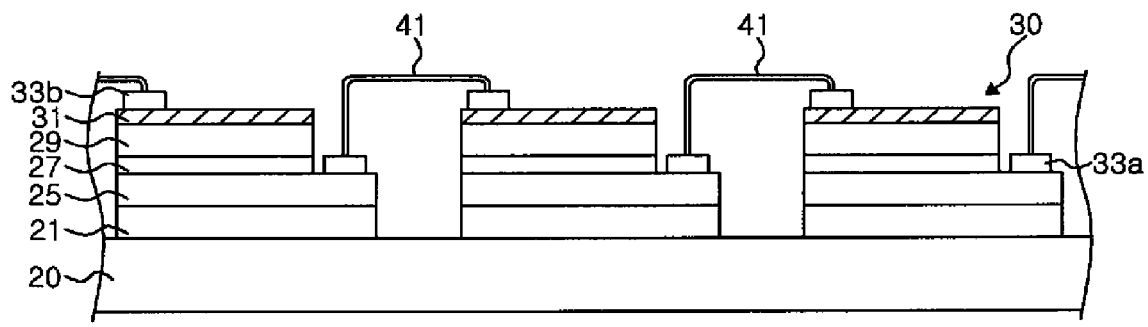
FIG. 5 is a partial sectional view illustrating an AC light-emitting diode (LED) according to an embodiment of the present invention.

FIG. 5 is a partial sectional view illustrating a light emitting diode (LED) according to an embodiment of the present invention.

Referring to FIG. 5, light emitting cells 30 spaced apart from one another are positioned on a substrate 20. Each of the light emitting cells 30 comprises a first conductive type semiconductor layer 25, a second conductive type semiconductor layer 29 positioned on a region of the first conductive type semiconductor layer 25, and an active layer 27 interposed between the first and second conductive type semiconductor layers. Here, the first and second conductive type semiconductor layers 25 and 29 are of an N-type and a P-type, or a P-type and an N-type, respectively.

An electrode 31 may be formed on the second conductive type semiconductor layer 29. The electrode 31 may be a transparent electrode through which light can be transmitted.

The light emitting cells 30 can be formed by forming the respective semiconductor layers and an electrode layer on the substrate 20 and then patterning them using photolithography and etching processes. The substrate 20 may be a substrate made of $Al_2O_3$, SiC, ZnO, Si, GaAs, GaP, $LiAl_2O_3$, BN, AN or GaN, and selected depending on the material of a semiconductor layer to be formed on the substrate 20. If a GaN based semiconductor layer is formed, the substrate 20 may be an $Al_2O_3$ or SiC substrate.

A buffer layer 21 may be interposed between the substrate 20 and each of the light emitting cells 30. The buffer layer 21 is a layer for reducing a lattice mismatch between the substrate 20 and subsequent layers in crystal growth. For example, the buffer layer 21 may be a GaN or AlN film. The N-type semiconductor layer is a layer in which electrons are produced and may be formed of GaN doped with N-type impurities. The P-type semiconductor layer is a layer in which holes are produced and may be formed of AlGaN doped with P-type impurities.

The active layer 27 is a region where predetermined band gaps and quantum wells are made so that electrons and holes can be recombined, and may include an $Al_xIn_yGa_zN$ layer. The wavelength of light emitted when the electrons and holes are combined varies depending on a compositional ratio of elements constituting the active layer 27. Thus, a compositional ratio is between Al, In and Ga is selected to emit light with a required wavelength, e.g., ultraviolet or blue light.

An electrode pad 33a may be formed on a region of the first conductive type semiconductor layer 25 and an electrode pad 33$b$ may be formed on the electrode 31. Each of the electrode pads 33$a$ and 33$b$ can be formed at a desired position using a lift-off technique.

Wires 41 electrically connect adjacent light emitting cells 30 to each other to form an array having the light emitting cells 30 connected in series. As shown in this figure, each of the wires 41 connects the electrode pad 33$a$ formed on the first conductive type semiconductor layer 25 of one light emitting cell to the electrode pad 33$b$ formed on the electrode 31 of the other light emitting cell. The wires 41 may be formed using an air bridge or step-coverage process.

Figure 6:
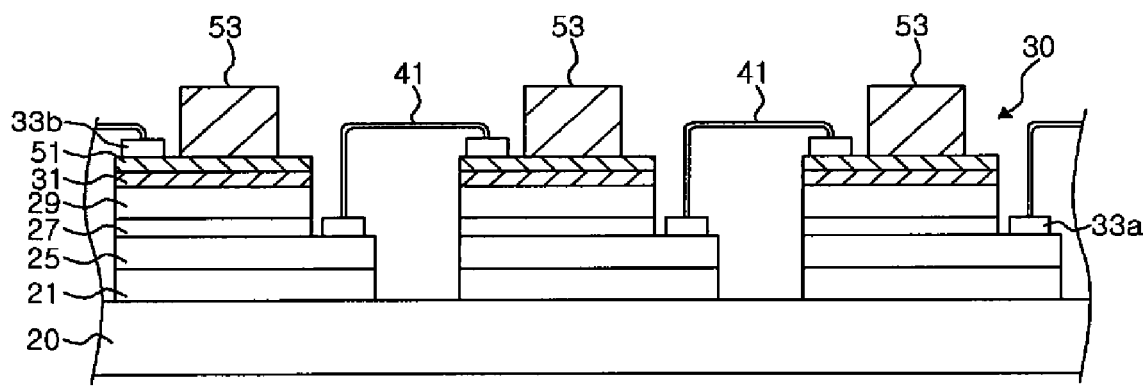
FIG. 6 is a partial sectional view illustrating an AC LED according to another embodiment of the present invention.

FIG. 6 is a sectional view illustrating an LED according to another embodiment of the present invention. Since the LED of this embodiment is mostly identical with that of FIG. 5, only a difference will be described.

Referring to FIG. 6, a reflective metal layer 51 is formed on each electrode 31. The reflective metal layer 51 may be formed as a single layer or multiple layers. For example, the reflective metal layer may be made of Ag, and barrier metal layers for preventing diffusion of Ag may be formed on and beneath the reflective metal layer, respectively. The reflective metal layer reflects light generated from the active layer 27 toward the substrate 20. Thus, it is preferred that the substrate 20 be a light transmitting substrate. The electrode pad 33$b$ may be formed on the reflective metal layer 51, or it may be omitted. Meanwhile, instead of formation of the reflective metal layer 51, the electrode 31 may be formed as a reflective metal layer.

Meanwhile, a metal bumper 53 is formed on the reflective metal layer 51. The metal bumper 53 is bonded on a submount (not shown) to transfer heat generated from a light emitting cell.

According to this embodiment, there may be provided a flip-chip type LED having the metal bumpers 53 thermally contacted with a submount. Such a flip-chip type LED has superior heat-dissipating efficiency and thus provides high light output.

Figure 7:
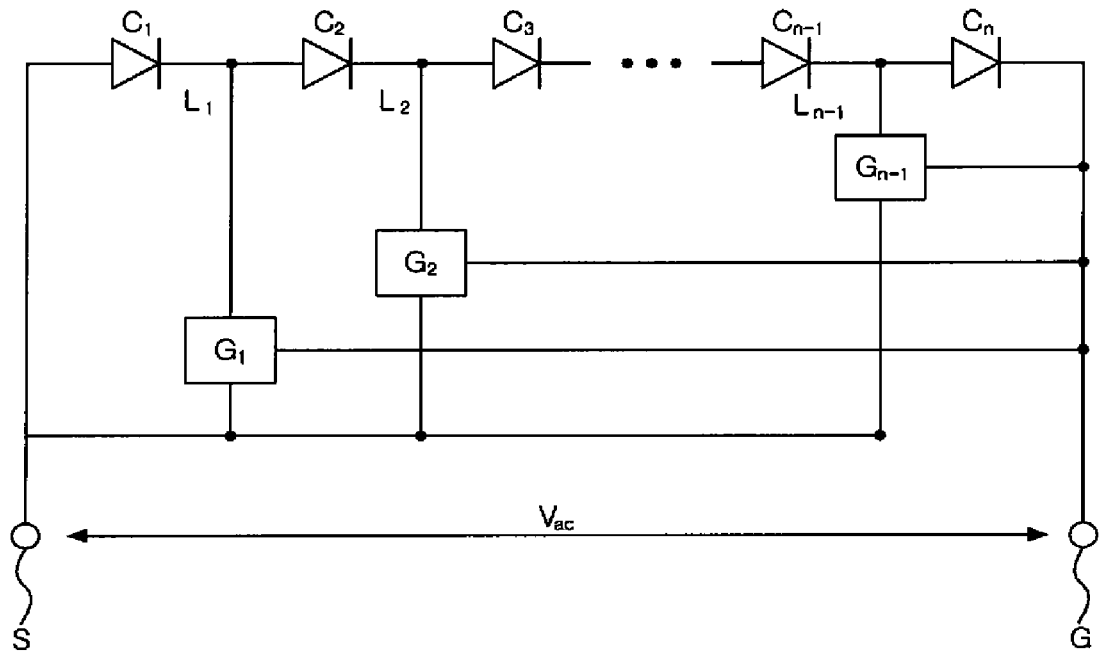
FIG. 7 is a schematic circuit diagram illustrating an AC light-emitting device according to a first embodiment of the present invention.
Figure 8:
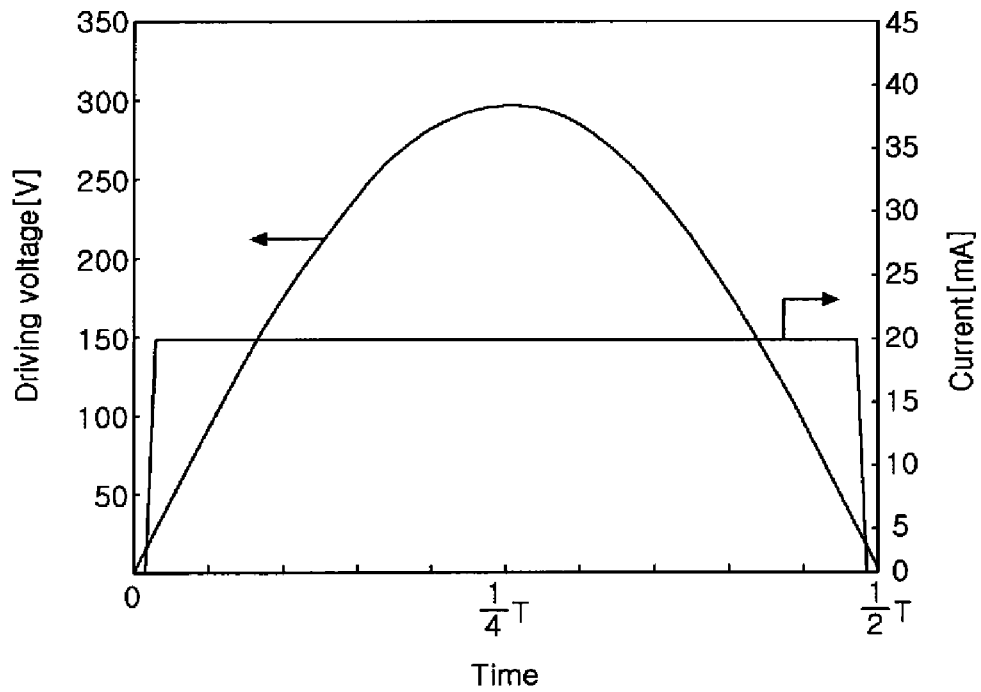
FIG. 8 is a schematic graph illustrating a driving voltage and a current with time in the AC light-emitting device according to the first embodiment of the present invention.

FIG. 7 is a schematic circuit diagram illustrating an AC light-emitting device according to a first embodiment of the present invention, and FIG. 8 is a schematic graph illustrating a driving voltage and a current with time in the AC light-emitting device according to the first embodiment of the present invention.

Referring to FIG. 7, the light emitting device comprises an array of light emitting cells $C_1$ to $C_n$ connected in series. The array is formed on a single LED chip. A plurality of arrays may be formed on a single chip and these arrays are connected in reverse parallel to one another. Accordingly, the light emitting cells are driven while being connected to an AC power source.

As described with reference to FIGS. 5 and 6, each of the light emitting cells comprises an N-type semiconductor layer, a P-type semiconductor layer and an active layer interposed therebetween. The semiconductor layers and the active layer may be formed as GaN based compound semiconductor layers. The semiconductor layers and the active layer are not limited to the GaN based compound semiconductor layer but may be formed of a variety of material films using various techniques.

The light emitting cells $C_1$ to $C_n$ are connected in series, and nodes $L_1$ to $L_{n-1}$ are positioned between light emitting cells. Switching blocks $G_1$ to $G_{n-1}$ are connected to the nodes $L_1$ to $L_{n-1}$, respectively. That is, the switching block $G_1$ is connected to the node $L_1$ between the light emitting cells $C_1$ and $C_2$, and the switching block $G_2$ is connected to the node $L_2$ between the light emitting cells $C_2$ and $C_3$. The switching block $G_{n-1}$ is connected to the node $L_{n-1}$ between the light emitting cells $C_1$ and $C_n$ in such a manner.

As an AC voltage $V_{ac}$ is increased in a forward direction, the switching blocks $G_1$ to $G_{n-1}$ are sequentially operated to turn on the light emitting cells $C_1$ to $C_n$ in sequence. Further, if the AC voltage passes a peak value and is decreased, the switching blocks $G_1$ to $G_{n-1}$ are sequentially operated again to turn off the light emitting cells $C_1$ to $C_n$ in sequence.

Each of the switching blocks $G_1$ to $G_{n-1}$ is connected to source terminal S and ground terminal G of the array of the light emitting cells. Here, if an AC voltage power source is electrically connected to both ends of the array, a terminal through which a current flows into the array is referred to as the source terminal S and a terminal through which a current flows out from the array is referred to as the ground terminal G. The AC voltage power source may be connected to the source terminal S, and the ground terminal G may be grounded. Alternatively, the source and ground terminals S and G may be connected to both ends of the AC voltage power source, respectively. Here, for the sake of convenience of illustration, the ground terminal G will be described as being grounded. If the ground terminal G is grounded, the switching blocks $G_1$ to $G_{n-1}$ may be separately grounded instead of being connected to the ground terminal G of the array.

The switching blocks $G_1$ to $G_{n-1}$ can be driven by means of a voltage difference between the source and ground terminals S and G, and this operation will be described below.

When a voltage $V_{ac}$ of the source terminal S is within a range of (Predetermined Voltage×n) to (Predetermined Voltage×(n+1)), each of the switching blocks $G_n$ shorts the node $L_n$ and the ground terminal G. Here, n denotes an ordinal number for a switching block. In this case, the switching blocks $G_1$ to $G_{n-1}$ bypass a current to the ground terminal G. Meanwhile, if the voltage $V_{ac}$ of the source terminal S is (Predetermined Voltage×(n+1)) or more, each of the switching blocks $G_n$ opens the node $L_n$ from the ground terminal G. In this case, the currents that are bypassed through the switching blocks $G_1$ to $G_{n-1}$ are cut off. Further, if the voltage $V_{ac}$ of the source terminal S is smaller than (Predetermined Voltage× n), each of the switching blocks $G_1$ to $G_{n-1}$ opens the node $L_n$ from the ground terminal G.

The predetermined voltage may be a forward voltage for the light emitting cells at a reference current. The reference current is determined in consideration of the light emitting efficiency of the light emitting cells. For example, the reference current may be determined as a current at which the light emitting efficiency of the light emitting cells is maximized. Such a current may be 15 to 25 mA and is 20 mA in GaN based semiconductor layers and active layers.

The operation of the light emitting device according to this embodiment will be described in detail below. Here, a forward voltage $V_f$ for a light emitting cell at a reference current will be described as the predetermined voltage.

If an AC voltage power source is connected to the source terminal S so that a voltage of the source terminal becomes larger than the forward voltage $V_f$, the switching block $G_1$ shorts the node $L_1$ and the ground terminal G. Accordingly, the reference current begins to flow through the light emitting cell $C_1$ and the switching block $G_1$, and the light emitting cell $C_1$ to is operated to emit light. If the AC voltage $V_{ac}$ further increases, a current exceeding the reference current flows through the light emitting cell $C_1$.

Subsequently, if the AC voltage reaches $2V_f$, the switching block $G_1$ opens the node $L_1$ from the ground terminal G to cut off a bypassing current. Meanwhile, the switching block $G_2$ shorts the node $L_2$ and the ground terminal G. Accordingly, the light emitting cell $C_2$ is turned on, and the reference current flows into the ground terminal G through the light emitting cells $C_1$ and $C_2$ and the switching block $G_2$. That is, the current is bypassed from the node $L_2$ to the ground terminal G by means of the switching block $G_2$.

As the AC voltage $V_{ac}$ is increased, the processes in which the switching blocks $G_1$ to $G_{n-1}$ are shorted and subsequently opened are repeated, so that the switching blocks $G_1$ to $G_{n-1}$ are sequentially opened, and thus, the light emitting cells $G_1$ to $G_n$ are sequentially turned on.

Meanwhile, if the AC voltage $V_{ac}$ is decreased after a time of T/4 has been elapsed, the opened switching block $G_{n-1}$ is shorted and the light emitting cell $C_n$ is turned off. Subsequently, if the AC voltage $V_{ac}$ is further decreased, the switching block $G_{n-1}$ is opened, and the opened switching block $G_{n-2}$ (not shown) is shorted to turn off the light emitting cell $C_{n-1}$. That is, as the AC voltage $V_{ac}$ is decreased, the processes in which the switching blocks $G_1$ to $G_{n-1}$ are shorted and subsequently opened are repeated in sequence, and the light emitting cells are sequentially turned off.

Table 1 below summarizes the turn-on and turn-off operations of the light emitting cells with time for a ½ cycle.

| Time | $C_1$ | $C_2$ | $C_3$ | ... | $C_n$ | $Cn_{-1}$ |
|------|-----|-----|-----|-----|-----|-------|
| 0    | off | off | off | ... | off | off |
|      | on  | off | off | ... | off | off |
|      | on  | on  | off | ... | off | off |
|      | on  | on  | on  | ... | off | off |
|      | on  | on  | on  | ... | on  | off |
| T/4  | on  | on  | on  | ... | on  | on  |
|      | on  | on  | on  | ... | on  | on  |
|      | on  | on  | on  | ... | on  | on  |
|      | on  | on  | on  | ... | on  | off |
|      | on  | on  | on  | ... | off | off |
|      | on  | on  | off | ... | off | off |
|      | on  | off | off | ... | off | off |
| T/2  | Off | off | off | ... | off | off |

Referring to Table 1, the light emitting cells $C_1$ to $C_n$ are sequentially turned on to with the lapse of time, and then turned off in reverse order after a time of T/4 has been elapsed. Under a driving voltage $V_{ac}$ at which all light emitting cells are turned on in a prior art, all the light emitting cells according to this embodiment are also turned on. Additionally, according to this embodiment, some light emitting cells are turned on even before the driving voltage $V_{ac}$ turns on all the light emitting cells.

Referring to FIG. 8, as the driving voltage $V_{ac}$ is increased, the current flowing through the light emitting cells $C_1$ to $C_n$ has a substantially constant current value until all the light emitting cells are turned on. The current substantially corresponds to the reference current. It will be apparent that if the driving voltage $V_{ac}$ is further increased even after all the light emitting cells have been turned on, the current flowing through the light emitting cells are increased.

Meanwhile, since the light emitting cells are sequentially turned on, some of the light emitting cells emit light even when the driving voltage $V_{ac}$ has a small value. Further, since the light emitting cells are sequentially turned off, some of the light emitting cells emit light even when the driving voltage $V_{ac}$ has a small value. Thus, an effective time during which the light emitting cells are driven is increased.

According to this embodiment, as the light emitting cells $C_1$ to $C_n$ are sequentially turned on and off, an effective time during which the light emitting cells are turned on to emit light is increased as a whole as compared with the prior art. Accordingly, if the same AC voltage power source as the prior art is used, light output is improved. In other words, even though a peak value of the driving voltage $V_{ac}$ is set to be smaller as compared with the prior art, it is possible to provide the same light output as the prior art. Thus, the light emitting cells can be driven using a low current. Accordingly, the junction temperature of the light emitting cells can be lowered, thereby improving the light emitting efficiency.

The switching blocks $G_1$ to $G_{n-1}$ are not limited to this embodiment but may be implemented into a variety of modifications. For example, the switching blocks may be configured as an identical circuit, and an additional circuit for sequentially operating the switching blocks may be added. Further, a circuit may be provided within or separately from the switching blocks to prevent an excessive current from flowing through operating light emitting cells when a source voltage $V_{ac}$ increases in a certain voltage range. For example, such a circuit may include a constant voltage source such as a zener diode, or a resistor. Accordingly, it can be prevented that an excessive current flows through light emitting cells $C_1$ to $C_{n-1}$ that have been turned on, before an arbitrary light emitting cell $C_n$ is turned on.

Meanwhile, at least two arrays of light emitting cells connected in series may be connected in reverse parallel to each other and switching blocks may be connected to nodes between the light emitting cells of each of the arrays, respectively. Meanwhile, the switching blocks may be connected in common to the respective arrays. Accordingly, the switching blocks can allow the light emitting cells within one array to be sequentially turned on or off during a ½ cycle and then allow the light emitting cells within another array to be sequentially turned on and off during a latter ½ cycle.

Figure 9:
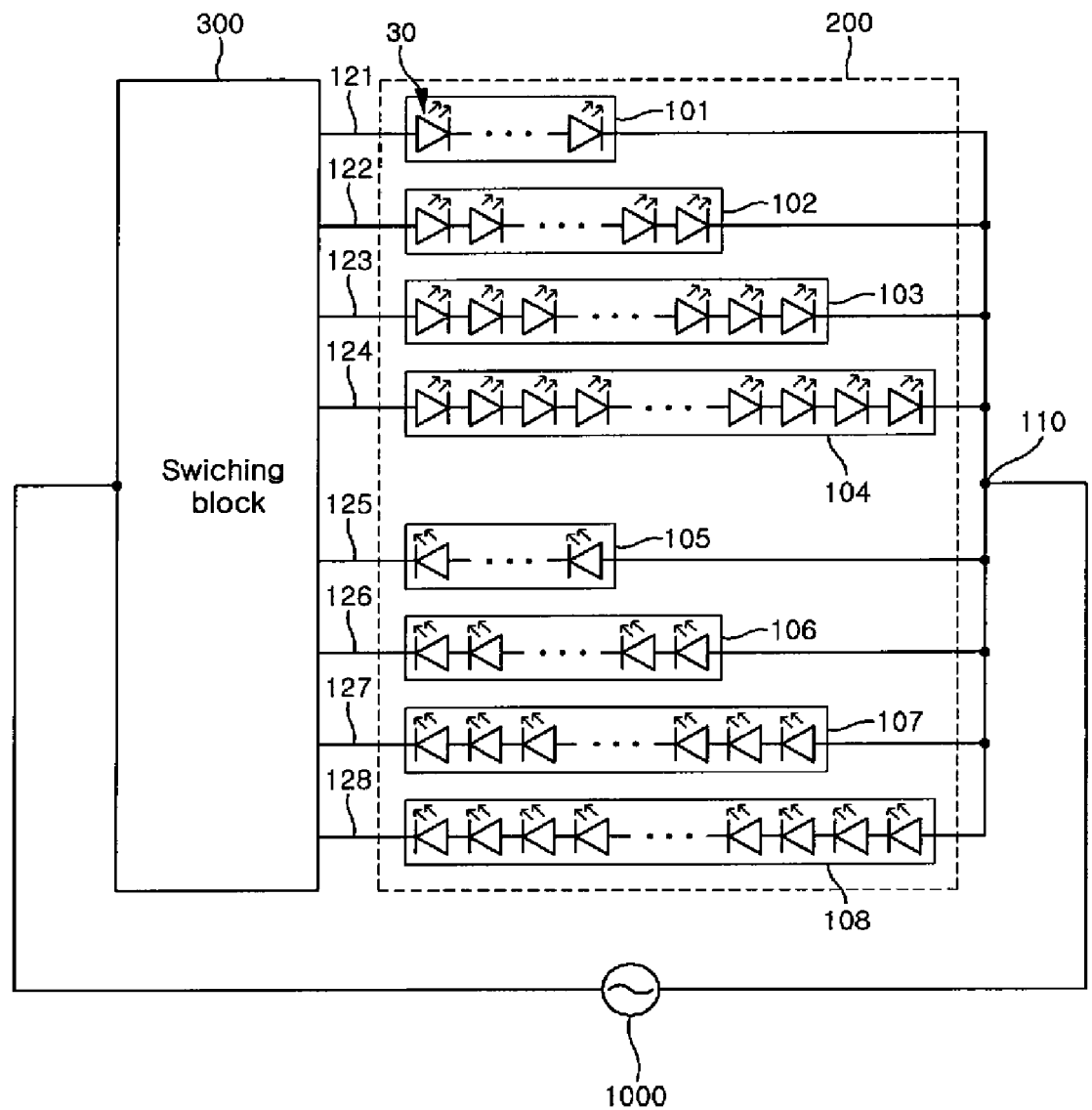
FIG. 9 is a schematic circuit diagram illustrating an AC light-emitting device according to a second embodiment of the present invention.
Figure 10:
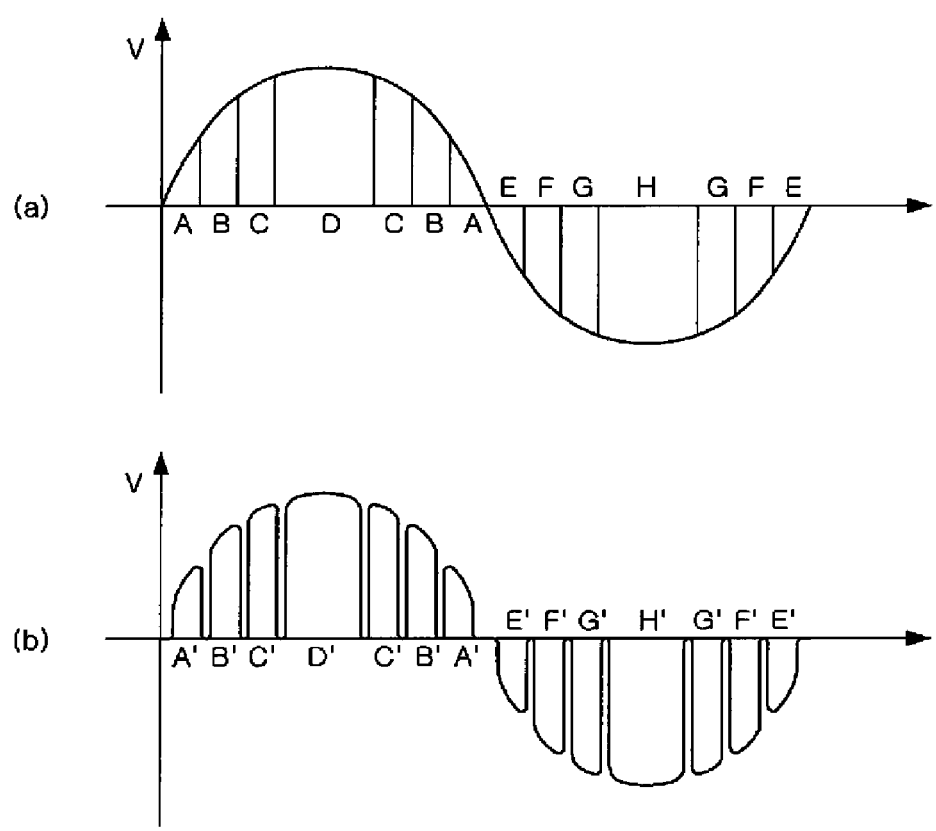
FIG. 10 is a schematic graph illustrating a driving voltage and a light emission amount of the AC light-emitting device according to the second embodiment of the present invention.

FIG. 9 is a schematic circuit diagram illustrating an AC light-emitting device according to a second embodiment of the present invention, and FIG. 10 is a schematic graph illustrating a driving voltage and a light emission amount of the AC light-emitting device according to the second embodiment of the present invention.

Referring to FIG. 9, the AC light-emitting device according to this embodiment comprises an LED 200 and a switching block 300. The LED 200 comprises a plurality of arrays 101 to 108 each of which has light emitting cells connected in series. The arrays 101 to 108 are positioned on a single substrate, and each of the arrays has the different number of the light emitting cells connected in series and thus is driven at a different voltage level.

One terminal of each of the arrays 101 to 108 is connected to a first power source connection terminal 110, and the other terminals thereof are connected to a plurality of second power source connection terminals 121 to 128, respectively. Meanwhile, the switching block 300 is connected to the plurality of second power source connection terminals 121 to 128 of the light emitting diode 200 to form a current path between an external power source 1000 and one of the second power source connection terminals 121 to 128 in accordance with for example, voltage values of the external power source 1000. Here, the first power source connection terminal 110 is connected to the external power source 1000.

For example, the LED 200 comprises 8 light emitting cell arrays 101 to 108 as shown in FIG. 9, and a plurality of light emitting cells 30 are connected in series in each of the light emitting cell arrays 101 to 108 such that they emit light under a different voltage.

That is, each of the first to fourth arrays 101 and 104 has the different number of the light emitting cells 30 that are connected in series and connected in a forward direction between the second power source connection terminals 121 to 124 and the first power source connection terminal 110. Each of the fifth to eighth arrays 105 to 108 has the different number of the light emitting cells 30 that are connected in series and connected in a reverse direction between the second power source connection terminals 125 to 128 and the first power source connection terminal 110. At this time, the terms "forward direction" and "reverse direction" are intended to indicate the flow direction of a current between two terminals. A direction in which a current flows from the second power source connection terminals 121 to 128 to the first power source connection terminal 110 with respect to the second power source connection terminals 121 to 128 is referred to as the forward direction, and a direction in which a current flows from the first power source connection terminal 110 to the second power source connection terminals 121 to 128 is referred to as the reverse direction.

Here, the second array 102 has the light emitting cells 30 of which the number is larger than that of the first array 101, the third array 103 has the light emitting cells 30 of which the number is larger than that of the second array 102, and the fourth array 104 has the light emitting cells 30 of which the number is larger than that of the third array 103. Further, the sixth array 106 has the light emitting cells 30 of which the number is larger than that of the fifth array 105, the seventh array 107 has the light emitting cells 30 of which the number is larger than that of the sixth array 106, and the eighth array 108 has the light emitting cells 30 of which the number is larger than the seventh array 107. At this time, the first to fourth arrays 101, 102, 103 and 104 preferably comprise the light emitting cells 30 of which the numbers are identical with those of the fifth to eighth arrays 105, 106, 107 and 108, respectively.

For example, when a 220V AC power source 1000 is used, the number of the light emitting cells 30 within each of the first and fifth arrays 101 and 105 may be selected such that they emit light in a range where the absolute value of an AC voltage is 1 to 70V, the number of the light emitting cells 30 within each of the second and sixth arrays 102 and 106 may be selected such that they emit light in a range where the absolute value of an AC voltage is 71 to 140V, the number of the light emitting cells 30 within each of the third and seventh arrays 103 and 107 may be selected such that they emit light in a range where the absolute value of an AC voltage is 141 to 210V, and the number of the light emitting cells 30 within each of the fourth and eighth arrays 104 and 108 may be selected such that they emit light in a range where the absolute value of an AC voltage is 211 to 280V.

The aforementioned voltage range is only for illustrative purposes, and the voltage range can be adjusted by changing the number of the light emitting cells connected in series within light emitting cell arrays. The number of the light emitting cells determines a driving voltage of a light emitting cell array.

As shown in FIG. 9, the switching block 300 according to this embodiment comprises a first terminal connected to one end of the AC power source 1000 and a plurality of second terminals respectively connected to the plurality of second power source connection terminals 121 to 128. Further, the switching block 300 comprises a voltage level determination unit for determining a voltage level of the AC power source 1000, and a switch for changing a current path between the AC power source 1000 and the second power source connection terminals 121 to 128 depending on a voltage level. The switching block 300 is selectively bypassed to the second power source connection terminals 121 to 128 in accordance with a voltage applied in a forward or reverse direction.

The switching block 300 forms current paths between the second power source connection terminals 121 to 128 of the first to eighth arrays 101 to 108 and the AC power source 1000 depending on the voltage level of the AC power source 1000. For example, if a low forward voltage is applied, a current path is formed between the AC power source 1000 and the second power source connection terminal 121 of the first array 101 so that the light emitting cells within the first array 101 can emit light, and if a high reverse voltage is applied, a current path is formed between the AC power source 1000 and the second power source connection terminal 128 of the eighth array 108 so that the light emitting cells within the eighth array 108 can emit light.

FIG. 10 is a schematic graph illustrating a driving voltage and a light emission amount of the AC light-emitting device according to this embodiment. Here, FIG. 10 (*a*) shows waveforms diagram of an AC power source, and FIG. 10 (*b*) shows a light emission amount of the light emitting device.

Referring to FIG. 10, current paths between the AC current power source 1000 and the first to eighth arrays 101 to 108 are changed by the switching block 300 depending on a voltage level of the AC power source 1000. That is, any one of the first to eighth arrays 101 to 108 emits light at a certain level. Thus, since the light emitting device according to this embodiment emits light at most voltage levels of the AC power source 1000, an electric power loss and a flicker effect are reduced.

As shown in FIG. 10 (*a*), the voltage of the AC power source 1000 is periodically changed with time. When the AC power source is in a forward direction, a voltage level of the forward power source is defined as regions A, B, C and D, and an array capable of emitting light is determined depending on the regions. That is, if the voltage of the AC power source 1000 exists within the region A, a current path is formed to the first array 101 by the switching block 300 so that the light emitting cells within the first array 101 can emit light (See A' in FIG. 10 (*b*)). Since a small number of the light emitting cells 30 are connected in series to each other in the first array 101, they are easily turned on with a small voltage. Further, if the voltage of the AC power source exists within the region B, a current path is formed to the second array 102 by the switching block 300 so that the light emitting cells within the second array 102 can emit light (See B' in FIG. 10 (*b*)). Furthermore, if the voltage of the AC power source exists within the region C, a current path is formed to the third array 103 by the switching block 300 so that the light emitting cells within the third array 103 can emit light (See C' in FIG. 10 (*b*)). In addition, if the voltage of the AC power source exists within the region D, a current path is formed to the fourth array 104 by the switching block 300 so that the light emitting cells within the fourth array 104 can emit light (See D' in FIG. 10 (*b*)).

Meanwhile, when the AC power source is applied in a reverse direction, a voltage level of the reverse power source is defined as regions E, F, G and H, and an array capable of emitting light is changed depending on the regions. That is, current paths are selectively formed to the fifth to eighth arrays 105, 106, 107 and 108 by the switching block 300 in accordance with the voltage level of the AC power source 1000, so that the light emitting cells within each of the arrays can sequentially emit light (See E', F', G' and H' in FIG. 10 (*b*)).

Figure 11:
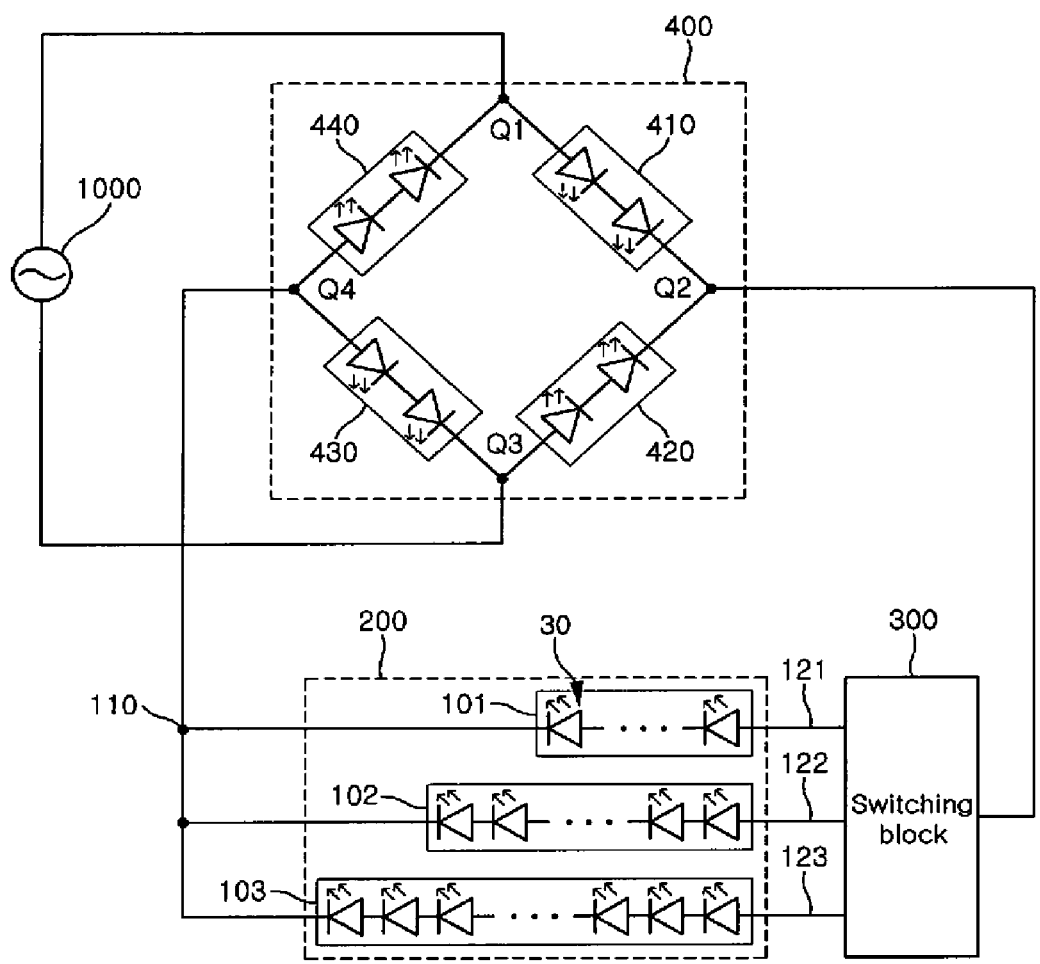
FIG. 11 is a schematic circuit diagram illustrating an AC light-emitting device according to a third embodiment of the present invention.
Figure 12:
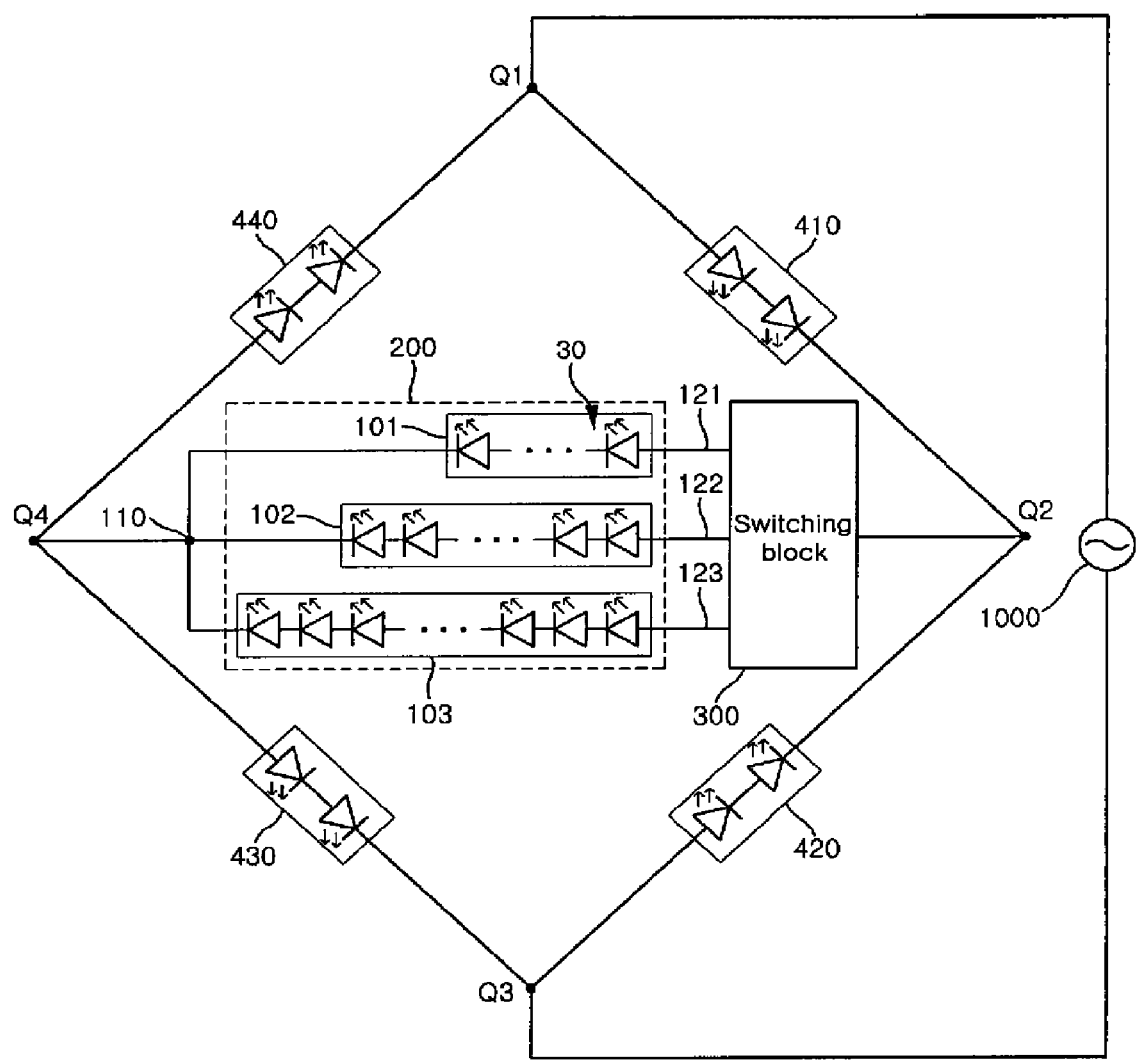
FIG. 12 is a schematic circuit diagram illustrating a modification of the AC light-emitting device according to the third embodiment of the present invention.
Figure 13:
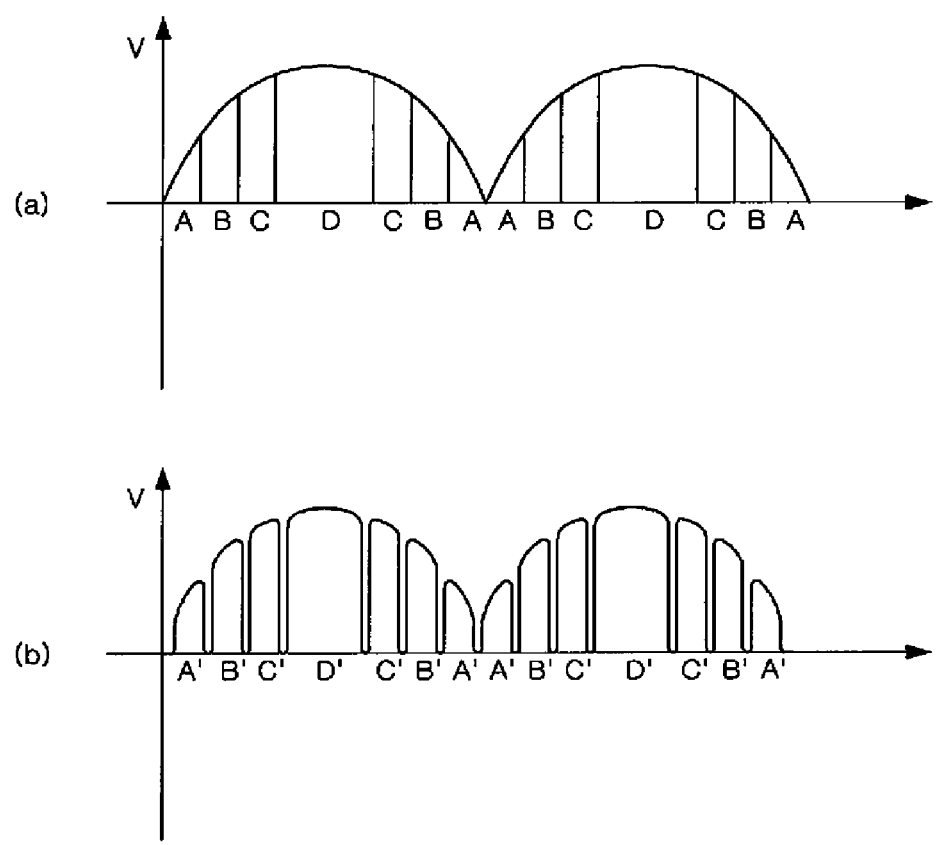
FIG. 13 is a schematic graph illustrating a driving voltage and a light emission amount of the AC light-emitting device according to the third embodiment of the present invention.

FIG. 11 is a schematic circuit diagram illustrating an AC light-emitting device according to a third embodiment of the present invention, FIG. 12 is a schematic circuit diagram illustrating a modification of the AC light-emitting device according to the third embodiment of the present invention, and FIG. 13 is a schematic graph illustrating a driving voltage and a light emission amount of the AC light-emitting device according to the third embodiment of the present invention.

Referring to FIGS. 11 and 12, the AC light-emitting device according to this embodiment comprises a bridge rectifier 400 for rectifying a current from an AC power source 1000, a plurality of arrays 101 to 103 each of which has a plurality light emitting cells connected in series therein, and a switching block 300 connected to the arrays. The arrays 101 to 103 have the different numbers of light emitting cells.

Meanwhile, one terminal of each of the plurality of arrays 101 to 103 is connected to a first power source connection terminal 110 connected to the bridge rectifier 400, and the other terminals thereof are connected to a plurality of second power source connection terminals 121 to 123, respectively. The switching block 300 is connected to the plurality of second power source connection terminals 121 to 123 of the light emitting device 200 and the bridge rectifier 400. The switching block 300 forms current paths between the bridge rectifier 400 and the second power source connection terminals 121 to 123 depending on the level of a voltage to be rectified by the bridge rectifier 400.

As shown in FIG. 11, the bridge rectifier 400 may be formed with diode portions 410 to 440 disposed between the first to fourth nodes Q1 to Q4. That is, anode and cathode terminals of the first diode portion 410 are connected to the first and second nodes Q1 and Q2, respectively. Anode and cathode terminals of the second diode portion 420 are connected to the third and second nodes Q3 and Q2, respectively. Anode and cathode terminals of the third diode portion 430 are connected to the fourth and third nodes Q4 and Q3, respectively. Anode and cathode terminals of the fourth diode portion 440 are connected to the fourth and first nodes Q4 and Q1, respectively. The first and fourth diode portions 410 to 440 may have the same structure as the light emitting cells 30. That is, the first and fourth diode portions 410 to 440 may be formed on the same substrate while forming the light emitting cells 30. At this time, the first and third nodes Q1 and Q3 of the bridge rectifier 400 are connected to the AC power source 1000, the second node Q2 is connected to the switching block 300, and the fourth node Q4 is connected to the first power source connection terminal 110.

The bridge rectifier 400 may be provided using rectification diodes separate from the LED 200.

As shown in FIG. 12, the LED 200 may be positioned inside a bridge rectifier. This shows that a bridge rectifier 400 is manufactured using extra light emitting cells formed on edge portions of an LED chip upon manufacture of a light emitting diode comprising arrays each of which has a plurality of light emitting cells connected in series.

FIG. 13 is a schematic graph illustrating the operation of the AC light-emitting device according to the third embodiment of the present invention. Here, FIG. 13 (a) is waveforms diagram of the AC power source applied to the second node Q2 of the bridge rectifier 400, and FIG. 13 (b) is a graph illustrating a light emission amount of the light emitting device.

When an AC voltage is applied, a power source with a form in which a reverse voltage is reversed is produced through the rectification operation of the bridge rectifier 400, as shown in FIG. 13 (a). Accordingly, only a forward voltage is applied to the switching block 300. Thus, the arrays 101, 102 and 103 are connected in parallel to each other such that the LED 200 can emit light in response to the forward voltage.

If the level of a voltage of the AC power source rectified by the bridge rectifier 400 exists in a region A, a current path is formed to the first array 101 by the switching block 300 so that the light emitting cells within the first array can emit light. At this time, if the applied voltage is larger than the sum of threshold voltages of the light emitting cells 30 connected in series within the first array 101, light emission is started, and a light emission amount is increased as the applied voltage is increased. Thereafter, a current path is formed to the second array 102 by the switching block 300 if the voltage rises so that the voltage level reaches a region B, and a current path is formed to the third array 103 if the voltage level reaches a region C.

The AC light-emitting device according to this embodiment emits light at almost all the voltage levels of an AC power source without power consumption, and a time during which light is emitted is increased to reduce a flicker effect.

Figure 14:
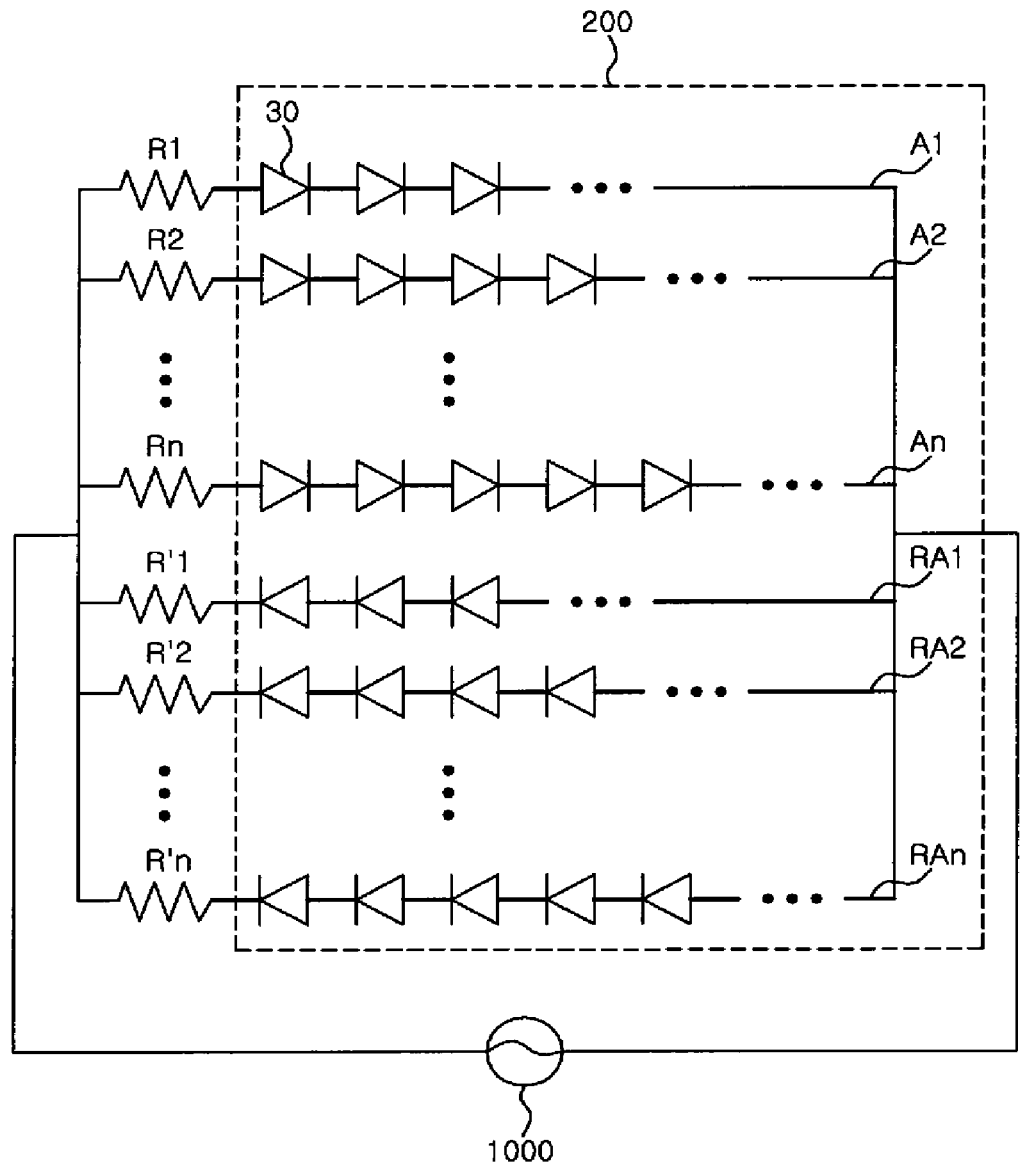
FIG. 14 is a schematic circuit diagram illustrating an AC light-emitting device according to a fourth embodiment of the present invention.

FIG. 14 is a circuit diagram illustrating an AC light-emitting device according to a fourth embodiment of the present invention. Hereinafter, n represents an integer of 2 or more.

Referring to FIG. 14, the light emitting device has an LED 200 and additionally, comprises first resistors R1 to Rn and second resistors R'1 to R'n.

The LED 200 comprises, on a single substrate, a plurality of first arrays A1 to An and a plurality of second arrays RA1 to RAn, each of which has the light emitting cells (30 in FIG. 5) connected in series. The first arrays A1 to An are connected in parallel to each other, and the second arrays RA1 to RAn are connected in reverse parallel to the first arrays.

The first arrays A1 to An have the different numbers of light emitting cells connected in series. That is, the number of the light emitting cells within the array A1 is smaller than that of the light emitting cells within the array A2, and the number of the light emitting cells within the array A2 is smaller than that of the light emitting cells within the array An. Further, the second arrays RA1 to RAn have the different numbers of light emitting cells connected in series. That is, the number of the light emitting cells within the array RA1 is smaller than that of the light emitting cells within the array RA2, and the number of the light emitting cells within the array RA2 is smaller than that of the light emitting cells within the array RAn.

The second arrays RA1 to RAn may have the light emitting cells of which the numbers correspond to those of the first arrays, respectively. That is, the array RA1 has the light emitting cells of which the number is identical with that of the array A1, the array RA2 has the light emitting cells of which the number is identical with that of the array A2, and the array RAn has the light emitting cells of the number is identical with that of the array An. Thus, the respective second arrays connected in reverse parallel are paired with the corresponding first arrays.

One end portions of the first and second arrays may be connected to one another on the substrate (20 in FIG. 5). To this end, a bonding pad (not shown) is provided on the substrate 20, and the end portions of the arrays may be connected to the bonding pad through wires. The wires for connecting the arrays to the bonding pad on the substrate 20 may be formed while forming the wires 41 in FIG. 5. Thus, it is unnecessary to connect the one end portions of the arrays through bonding wires, resulting in simplification of a wiring process.

Meanwhile, in the first and second arrays A1 to An and RA1 to RAn, an array having the greater number of the light emitting cells may have larger light emitting cells 30. That is, the light emitting cells within the same array may have the active layers (27 in FIG. 5) with substantially same sizes, but the light emitting cells within different arrays may have the active layers with different sizes. As the active layer 27 of the light emitting cell becomes large, the bulk resistance of the light emitting cell 30 is decreased. Accordingly, as a voltage is increased under a voltage larger than a threshold voltage, the amount of a current flowing through the light emitting cell 30 is rapidly increased.

Meanwhile, the first resistors R1 to Rn are connected in series to the first arrays A1 to An, respectively, and the second resistors R'1 to R'n are connected in series to the second arrays RA1 to RAn, respectively. The first and second resistors may be connected to the arrays through wires, respectively.

The first resistors R1 to Rn may have different resistance values, and the second resistors R'1 to R'n may also have different resistance values. At this time, it is preferred that the first and second resistors be respectively connected in series to the first and second arrays in such a manner that a resistor with a larger resistance value is connected to an array with the smaller number of the light emitting cells 30. That is, the resistor R1 or R'1 with a larger resistance value is connected in series to the array A1 or RA1 with the smaller number of the light emitting cells 30, and the resistor Rn or R'n with a smaller resistance value is connected in series to the array An or RAn with a greater number of the light emitting cells 30.

End portions of the resistors and end portions of the arrays are connected to both terminals of the AC power source 1000. Here, the AC power source 1000 may be a general household AC voltage power source. The operation of the AC light-emitting device will be described in detail below.

First, a half cycle in which a positive voltage is applied to the resistors and a negative voltage is applied to one end portion of each of the arrays opposite to the resistors by means of the AC power source will be described.

As an AC voltage is increased from a zero voltage, the first arrays A1 to An biased in a forward direction are turned on. Since the first arrays A1 to An have the different numbers of the light emitting cells 30, they are turned on, starting from the array A1 with the smaller number of the light emitting cells 30. The array A1 is turned on when the AC current exceeds the sum of threshold voltages of the light emitting cells within the array A1. As the AC voltage is increased, a current is increased to emit light. Meanwhile, if the AC voltage is further increased and thus the current is increased, a voltage drop due to the resistor R1 becomes larger. Accordingly, an excessive current is prevented from flowing through the array A1.

If the AC voltage is further increased and thus exceeds the sum of the threshold voltages of the light emitting cells within the array A2, the array A2 is turned on to emit light. As such a process is repeated, the array An is turned on to emit light. That is, the arrays are sequentially turned on, starting from an array with the smaller number of the light emitting cells 30.

Subsequently, if the AC voltage passes the maximum peak value at T/4 and then becomes smaller than the sum of the threshold voltages of the light emitting cells within the array An, the array An is turned off. Thereafter, the AC voltage is further decreased, so that the array A2 is turned off and the array A1 is then turned off. That is, the first arrays are sequentially turned off, starting from an array with the greater number of the light emitting cells 30. This is achieved in an order reverse to the order in which the arrays are turned on.

When the AC voltage becomes zero again, the half cycle is completed. In the latter half cycle, the second arrays RA1 to RAn that are biased in a forward direction as the phase of the AC voltage is changed are operated. The second arrays are operated in the same manner as the first arrays.

According to this embodiment, there is provided an AC light-emitting device driven by means of the AC power source 1000. Further, since the processes in which the first and second arrays A1 to An and RA1 to RAn are sequentially turned on and then turned off in the reverse order are repeated, a flicker effect can be reduced and a time during which the light emitting device emits light can be increased as compared with a conventional light emitting device.

Meanwhile, by connecting a resistor with a larger resistance value to an array with the smaller number of the light emitting cells, an excessive current can be prevented from flowing through an array that has been first turned on due to increase in the voltage.

Further, by connecting larger light emitting cells to an array with the greater number of the light emitting cells, it is possible to rapidly increase the amount of a current flowing through arrays that are turned on later according to increase in the voltage. That is, the bulk resistance of an array with the greater number of the light emitting cells may be smaller than that of an array with the smaller number of the light emitting cells. Thus, once an array with the greater number of the light emitting cells is turned on, a current flowing through the array is rapidly increased as the voltage is increased. Accordingly, an excessive current is prevented from flowing through an array that has been first turned on. Further, since an excessive current can be prevented by adjusting the sizes of light emitting cells, differences between the resistance values of the resistors can be reduced, and consequently, the resistance values of the resistors can be decreased. The decrease in the resistance values of the resistors causes increase in light output of the light emitting cells.

Figure 15:
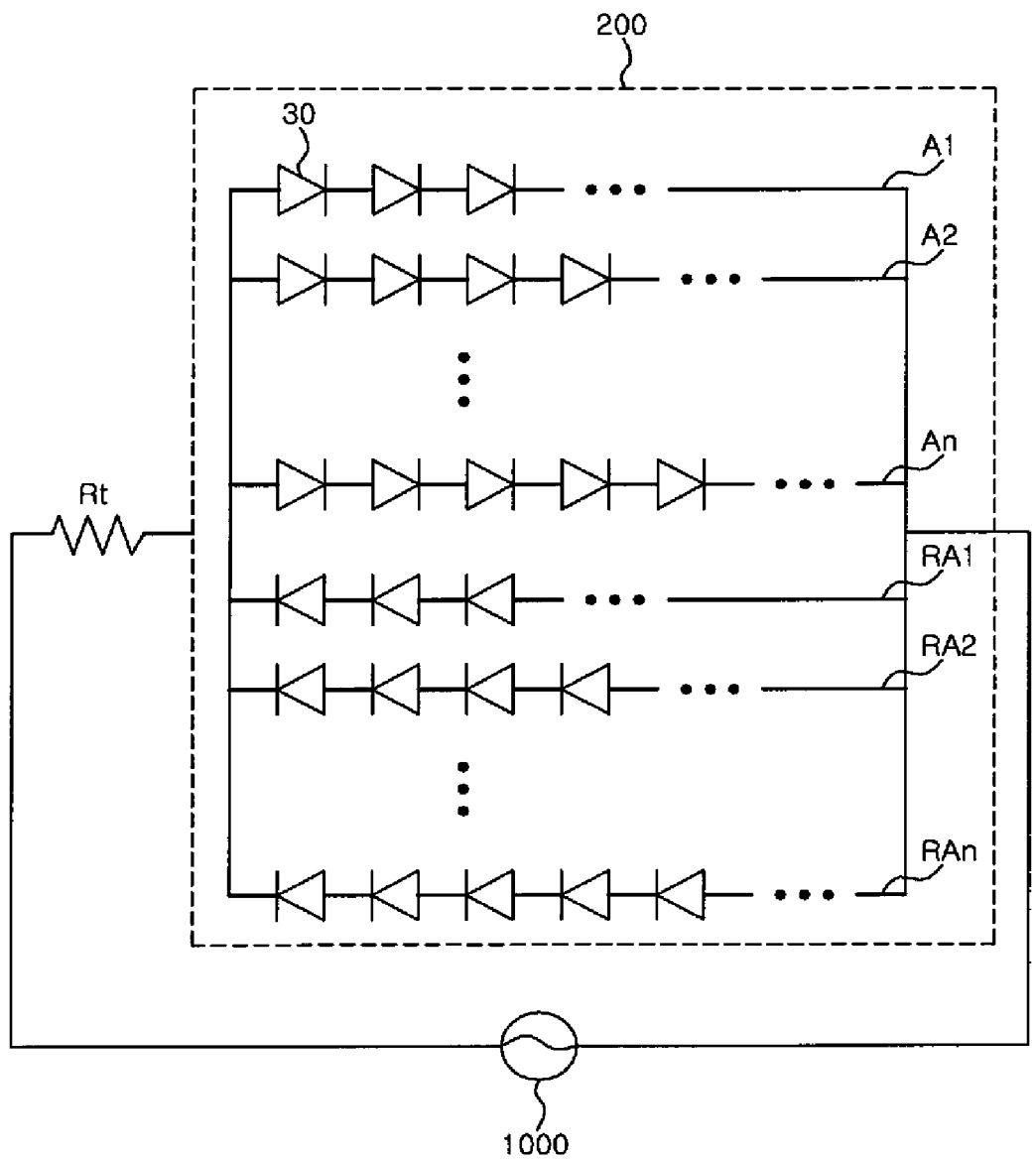
FIG. 15 is a schematic circuit diagram illustrating an AC light-emitting device according to a fifth embodiment of the present invention.

FIG. 15 is a schematic circuit diagram illustrating an AC light-emitting device according to a fifth embodiment of the present invention.

Referring to FIG. 15, the light emitting device has an LED 200 and additionally, has a common resistor Rt. The LED 200 has components that are substantially identical with those of the LED 200 described with reference to FIG. 14.

In the LED 200, one end portions of the first and second arrays A1 to An and RA1 to RAn may be connected to one another on the substrate 20 in FIG. 5, as described with reference to FIG. 14. Additionally, the other end portions of the first and second arrays may also be connected to one another on the substrate 20 in FIG. 5. The other end portions may be connected to a bonding pad (not shown) provided on the substrate 20 through wires, and the wires may be formed while forming the wires 41 of FIG. 5.

Meanwhile, instead of the first and second resistors R1 to Rn and R'1 to R'n in FIG. 14, the common resistor Rt is serially connected in common to the first and second arrays A1 to An and RA1 to RAn. At this time, the common resistor Rt may be connected on the bonding pad through a wire.

According to this embodiment, since the common resistor Rt is connected to the first and second arrays, a process of connecting a resistor is simplified as compared with the light emitting device of FIG. 14.

Figure 16:
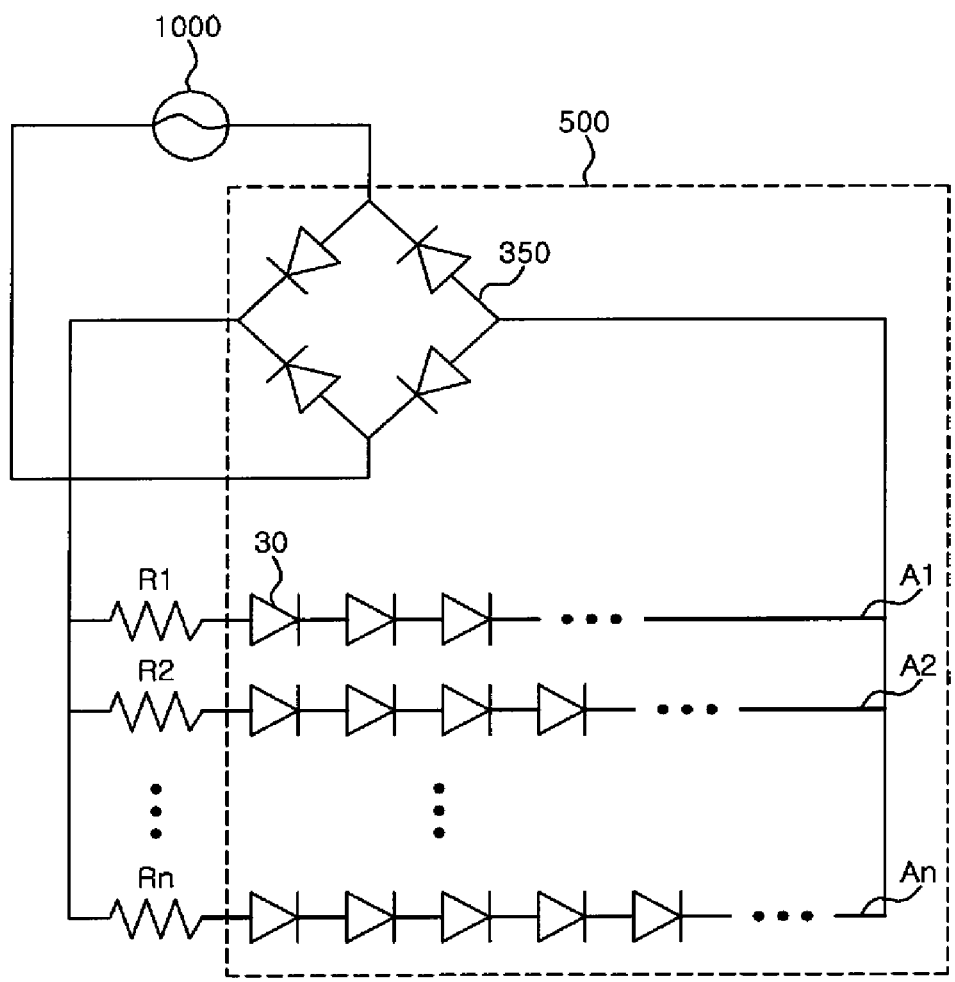
FIG. 16 is a schematic circuit diagram illustrating an AC light-emitting device according to a sixth embodiment of the present invention.

FIG. 16 is a schematic circuit diagram illustrating an AC light-emitting device according to a sixth embodiment of the present invention.

Referring to FIG. 16, the light emitting device has an LED 500 and a bridge rectifier 350, and may include resistors R1 to Rn.

The LED 500 comprises a plurality of arrays A1 to An each of which has light emitting cells 30 connected in series on the single substrate 20 in FIG. 5. The arrays A1 to An are connected in parallel to one another.

The arrays A1 to An have the different numbers of light emitting cells connected in series. That is, the number of the light emitting cells within the array A1 is smaller than that of the light emitting cells within the array A2, and the number of the light emitting cells within the array A2 is smaller than that of the light emitting cells within the array An.

One end portions of the arrays may be connected to one another on the substrate 20 in FIG. 5. To this end, a bonding pad (not shown) is provided on the substrate 20, and the end portions of the arrays may be connected to the bonding pad through wires. The wires for connecting the arrays to the bonding pad on the substrate 20 may be formed while forming the wires 41 in FIG. 5.

Further, in the arrays A1 to An, an array with the greater number of the light emitting cells may have larger light emitting cells 30.

The bridge rectifier 350 may be configured with light emitting cells identical with the light emitting cells 30. Thus, the light emitting cells of the bridge rectifier may be formed while forming the light emitting cells 30.

One end portions of the arrays A1 to An are connected in common to one node of the bridge rectifier 350. Such connection can be achieved by connecting the one node and the bonding pad through a wire.

Meanwhile, the resistors R1 to Rn may be connected in series to the arrays A1 to An, respectively.

The resistors R1 to Rn may have different resistance values. At this time, it is preferred that the resistors be respectively connected in series to the arrays in such a manner that a resistor with a larger resistance value is connected to an array with the smaller number of the light emitting cells 30. That is, the resistor R1 with a larger resistance value is connected in series to the array A1 with the smaller number of the light emitting cells 30, and the resistor Rn with a smaller resistance value is connected in series to the array An with the greater number of the light emitting cells 30.

As shown in this figure, one end portions of the resistors R1 to Rn are connected to another node of the bridge rectifier.

Both terminals of the AC power source 1000 are connected to two other nodes of the bridge rectifier 350, respectively. Here, the AC power source 1000 may be a general household AC voltage power source. The operation of the AC light-emitting device will be described below.

First, when a voltage is applied by the AC power source 1000, a positive voltage is applied to the resistors through the bridge rectifier 350 and a negative voltage is applied to one end portions of the arrays opposite to the resistors.

As an AC voltage is increased from a zero voltage, the first arrays A1 to An biased in a forward direction are turned on. Since the first arrays A1 to An have the different numbers of the light emitting cells 30, they are turned on, starting from the array A1 with the smaller number of the light emitting cells 30. The array A1 is turned on when the AC current exceeds the sum of threshold voltages of the light emitting cells within the array A1. As the AC voltage is increased, a current is increased to emit light. Meanwhile, if the AC voltage is further increased and thus the current is increased, a voltage drop due to the resistor R1 becomes larger. Accordingly, an excessive current is prevented from flowing through the array A1.

If the AC voltage is further increased and thus exceeds the sum of the threshold voltages of the light emitting cells within the array A2, the array A2 is turned on to emit light. As such a process is repeated, the array An is turned on to emit light. That is, the arrays are sequentially turned on, starting from an array with the smaller number of the light emitting cells 30.

Subsequently, if the AC voltage passes the maximum peak value at T/4 and then becomes smaller than the sum of the threshold voltages of the light emitting cells within the array An, the array An is turned off. Thereafter, the AC voltage is further decreased, so that the array A2 is turned off and the array A1 is then turned off. That is, the first arrays are sequentially turned off, starting from an array with the greater number of the light emitting cells 30. This is achieved in an order reverse to the order in which the arrays are turned on.

When the AC voltage becomes zero again, the half cycle is completed. Even in the latter half cycle, the arrays A1 to An are operated in the same manner by the bridge rectifier 350.

According to this embodiment, there is provided an AC light-emitting device driven by means of the AC power source 1000. Further, since the processes in which the arrays A1 to An are sequentially turned on and then turned off in the reverse order are repeated, a flicker effect can be reduced and a time during which the light emitting device emits light can be increased as compared with a conventional light emitting device.

Although the resistors R1 to Rn are respectively connected in series to the arrays A1 to An in this embodiment, the common resistor Rt instead of the resistors R1 to Rn may be connected as shown in FIG. 15. In this case, the end portions of the arrays A1 to An may be connected to one another on the substrate 20 in FIG. 5.

Figure 17:
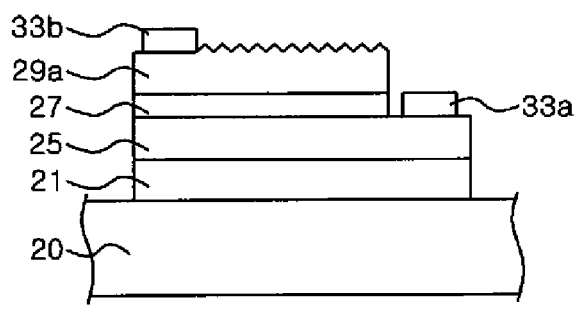
FIGS. 17 and 18 are sectional views illustrating LEDs applicable to the embodiments of the present invention.
Figure 18:
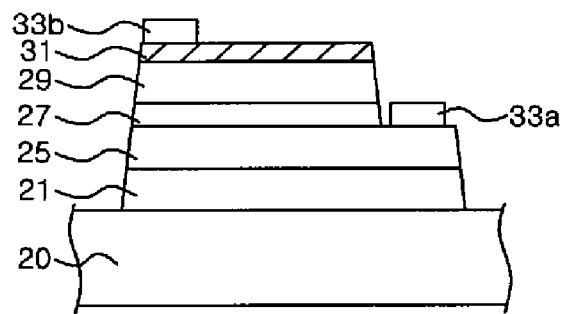

Meanwhile, in the aforementioned embodiments, the number of the light emitting cells or a difference in size between the light emitting cells generates a difference in relative luminous intensity between the arrays. That is, since an array that is first turned on has the smaller number of the light emitting cells, overall luminous intensity thereof is relatively weak. Moreover, since an array that is finally turned on has the greater number of the light emitting cells, luminous intensity thereof is relatively strong. Such a difference may be enlarged due to differences in the sizes of the light emitting cells and the resistors. Although there is an advantage in that the arrays are early turned on, the luminous intensity of the arrays initially turned on is relatively small. Thus, it may not greatly contribute to reduction in the flicker effect. Thus, it is necessary to increase the luminous intensity of the arrays initially turned on. To this end, the structures of the light emitting cells within the respective arrays may be constructed differently. FIGS. 17 and 18 are sectional views illustrating LEDs in which the structures of light emitting cells within some arrays are modified to increase the luminous intensity of the light emitting cells within the arrays.

Referring FIG. 17, the LED according to this embodiment is substantially identical with that described with reference to FIG. 5, and the light emitting cell arrays may be arranged in the same manner as the first to sixth embodiments. However, the light emitting cell in this embodiment is different from that of FIG. 5 in that a top surface of the light emitting cell, e.g., the surface of a second conductive type semiconductor layer 29*a*, is roughened.

Light emitting cells each of which has the second conductive type semiconductor layer 29*a* with the roughened surface may construct the arrays in the first and sixth embodiments of the present invention, which have been previously described above. Further, in the first and sixth embodiments, arrays of which the number is ½ or less of the number of entire arrays may be constructed of the light emitting cells having the second conductive type semiconductor layers 29*a* with the roughened surfaces. For example, arrays of which the number is ½ or less of the number of the first arrays and arrays of which the number is ½ or less of the number of the second arrays in FIGS. 14 and 15 may be constructed of the light emitting cells having the second conductive type semiconductor layers 29*a* with the roughened surfaces; and arrays of which the number is ½ or less of the number of the arrays in FIG. 16 may be constructed of the light emitting cells having the second conductive type semiconductor layers 29*a* with the roughened surfaces. At this time, the light emitting cells having the second conductive type semiconductor layers 29*a* with the roughened surfaces constitute arrays having the smaller number of the light emitting cells, and arrays having the greater number of the light emitting cells are constructed of light emitting cells having flat surfaces.

The second conductive type semiconductor layer 29a with the roughened surface may be formed by sequentially forming a first conductive type semiconductor layer 25, an active layer 27 and the second conductive type semiconductor layer, and etching a region of the second conductive type semiconductor layer using a photoelectrochemical etching technique. Meanwhile, the roughened surface may be formed by forming a metallic thin film, e.g., with a thickness of 10 to 500 Å, in a region of the second conductive type semiconductor layer and performing heat treatment and etching of the metallic thin film.

Thereafter, the array(s) of the light emitting cells each of which has the second conductive type semiconductor layer 29a with the roughened surface is formed by etching the region of the semiconductor layers to form the light emitting cells and electrically connecting the light emitting cells to one another.

Meanwhile, an electrode pad 33b is formed on the second conductive type semiconductor layer 29a with the roughened surface, and the electrode 31 in FIG. 5 may also be formed thereon.

The arrays each of which has the smaller number of the light emitting cells, e.g., the arrays A1 and RA1 of FIGS. 14 and 15 or the array A1 of FIG. 16, are constructed of the light emitting cells having the roughened surfaces, so that the luminous intensity of these arrays can be increased. Thus, since the luminous intensity of the arrays A1 and RA1 that are initially turned on when an AC voltage is applied thereto is large, a flicker effect can be further reduced.

The roughened surface may be formed on a bottom surface of the substrate of FIG. 6. Alternatively, the substrate 20 may be separated in FIG. 6 and the roughened surface may be formed on a bottom surface of the first conductive type semiconductor layer 25.

Referring to FIG. 18, light emitting cells in this embodiment are substantially identical with those described with reference to FIG. 5, and light emitting cell arrays may be arranged in the same manner as described in the first to sixth embodiments. However, in this embodiment, each of the light emitting cells is formed to have inclined side surfaces. The light emitting cells each of which has the inclined side surfaces constitute the arrays (A1 and RA1 in FIGS. 14 to 17) that are initially turned on in the same manner as the light emitting cells having the roughened surfaces, and may constitute arrays of which the number is ½ of the number of the first and second arrays in FIGS. 14 to 17.

The inclined side surfaces may be formed by reflowing a photoresist pattern, and then etching the semiconductor layers using the photoresist pattern as an etching mask, in the separation process of the light emitting cells after the formation of semiconductor layers. Additionally, the inclined side surfaces may be formed by performing reflow of the photoresist pattern and etching the second conductive type semiconductor layer and the active layer when a region of the first conductive type semiconductor layer 25 is exposed.

The inclined side surfaces of the light emitting cells can reduce a light loss due to total reflection, thereby improving luminous intensity of the light emitting cells. Thus, by forming arrays, which are initially turned on, out of such light emitting cells, a flicker effect can be reduced as described with reference to FIG. 17.

Figure 19:
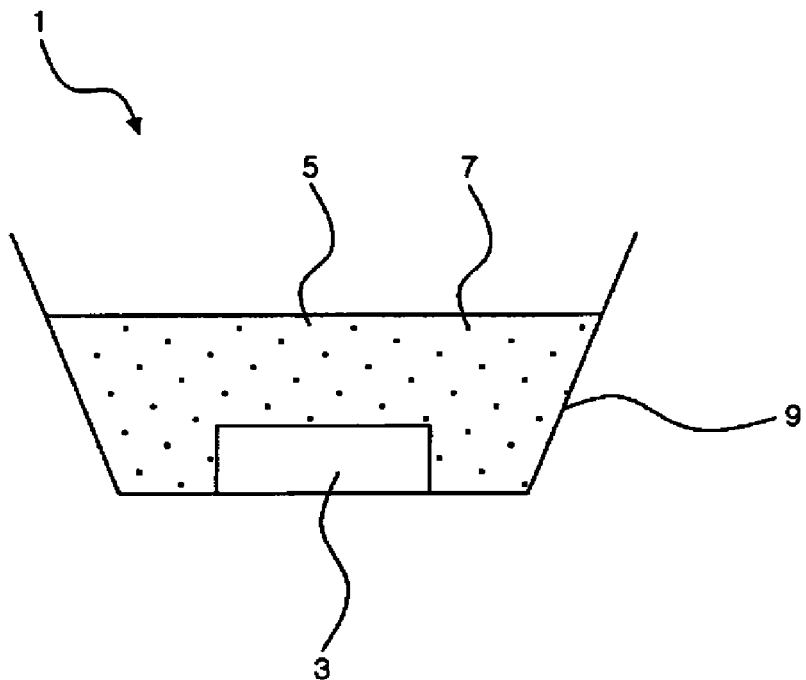
FIG. 19 is a sectional view illustrating an AC light-emitting device according to a seventh embodiment of the present invention.

FIG. 19 is a sectional view illustrating an AC light-emitting device 1 according to a seventh embodiment of the present invention.

Referring to FIG. 19, the light emitting device 1 comprises an LED chip 3. The LED chip 3 has a plurality of light emitting cells connected in series. Each of the light emitting cells may be an $Al_xIn_yGa_zN$ based compound semiconductor capable of emitting ultraviolet or blue light. The structures of the LED chip 3 and the light emitting cells are identical with those described with reference to FIG. 5 or 6. The light emitting cells are connected in series and constitute an array. The LED chip 3 may comprise two arrays connected in reverse parallel, or may comprise a bridge rectifier, so that it can be driven by means of an AC power source.

The LED chip 3 is electrically connected to an external power source through lead terminals (not shown). To this end, the LED chip 3 may have two bonding pads (not shown) used for connection to the lead terminals. The bonding pads are connected to the lead terminals through bonding wires (not shown). On the contrary, the LED chip 3 may be flip-bonded to a submount substrate (not shown) and then electrically connected to the lead terminals through the submount substrate.

Meanwhile, the LED chip 3 may be positioned within a reflection cup 9. The reflection cup 9 reflects light emitted from the LED chip 3 in a range of desired viewing angles to increase luminance within a certain range of viewing angles. Thus, the reflection cup 9 has a predetermined inclined surface depending on a required viewing angle.

Meanwhile, phosphors 7 are positioned over the LED chip 3 and then excited by light emitted from the light emitting cells to emit light in a visible light range. The phosphors 7 include a delay phosphor. The delay phosphor may have a decay time of 1 msec or more, preferably, about 8 msec or more. Meanwhile, an upper limit of the decay time of the delay phosphor can be selected depending on uses of light emitting devices and may be, but not specifically limited to, 10 hours or less. Particularly, in case of a light emitting device used for general household illumination, the decay time of the delay phosphor is preferably a few minutes or less.

The delay phosphor may be a silicate, an aluminate, a sulfide phosphor or the like disclosed in U.S. Pat. Nos. 5,770, 111, 5,839,718, 5,885,483, 6,093,346, 6,267,911 and the like. For example, the delay phosphor may be $(Zn,Cd)S:Cu$, $SrAl_2O_4:Eu,Dy$, $(Ca,Sr)S:Bi$, $ZnSiO_4:Eu$, $(Sr,Zn,Eu,Pb,Dy)O.(Al,Bi)_2O_3$, $m(Sr,Ba)O.n(Mg,M)O.2(Si,Ge)O_2:Eu,Ln$ (wherein, $1.5 \leq m \leq 3.5$; $0.5 \leq n \leq 1.5$; M is at least one element selected from the group consisting of Be, Zn and Cd; and Ln is at least one element selected from the group consisting of Sc, Y, La, Ce, Pr, Nd, Sm, Gd, Th, Dy, Ho, Er, Tm, Yb, Lu, B, Al, Ga, In, Tl, Sb, Bi, As, P, Sn, Pb, Ti, Zr, Hf, V, Nb, Ta, Mo, W, Cr and Mn), or the like.

The delay phosphor is excited by light emitted from the LED chip 3 to emit light in the visible light range, e.g., red, green and/or blue light. Accordingly, it is possible to provide a light emitting device capable of emitting light having various colors by mixing light emitted from the LED chip 3 with light emitted from the delay phosphor, and to provide a light emitting device capable of emitting white light.

Meanwhile, the phosphors 7 may include other phosphors capable of emitting light in the visible light range while being excited by light from the LED chip 3, e.g., red, green and/or blue phosphors, or yellow phosphors, in addition to the delay phosphor. For example, the other phosphors may be YAG:Ce based phosphors, orthosilicate based phosphors, or sulfide phosphors.

The delay phosphors and the other phosphors are selected such that the light emitting device emits light having a desired color. In case of a white light emitting device, the delay phosphor and the other phosphors may be formed of various combinations of phosphors such that light obtained by mixture of light emitted from the LED chip 3 with converted light becomes white light. Further, a combination of the delay phosphor and the other phosphors may be selected in consideration of flicker effect prevention, light emitting efficiency, a color rendering index, and the like.

Meanwhile, a transparent member 5 may cover the LED chip 3. The transparent member 5 may be a coating layer or a molded member formed using a mold. The transparent member 5 covers the LED chip 3 to protect the LED chip 3 from external environment such as moisture or an external force. For example, the transparent member 5 may be made of epoxy or silicone resin. In a case where the LED chip 3 is positioned within the reflection cup 9, the transparent member 5 may be positioned within the reflection cup 9 as shown in this figure.

The phosphors 7 may be positioned between the transparent member 5 and the LED chip 3. In this case, the transparent member 5 is formed after the phosphors 7 have been applied to the LED chip 3. On the contrary, the phosphors 7 may be dispersed within the transparent member 5 as shown in this figure. There have been known a variety of techniques of dispersing the phosphors 7 within the transparent member 5. For example, the transparent member 5 may be formed by performing transfer molding using mixed powder with phosphors and resin powder mixed therein, or by dispersing phosphors within liquid resin and curing the liquid resin.

Figure 20:
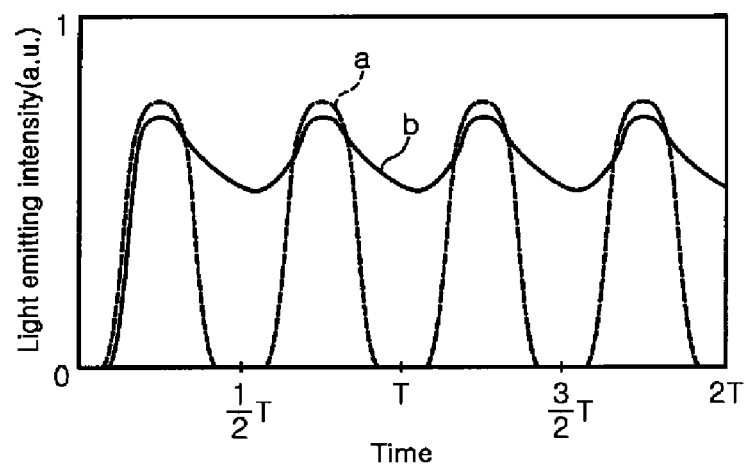
FIG. 20 is a schematic graph illustrating a light emitting characteristic of an AC light-emitting device according to the seventh embodiment of the present invention.

FIG. 20 is a schematic graph illustrating a light emitting characteristic of an AC light-emitting device according to an embodiment of the present invention. Here, a dotted line (a) is a curve schematically illustrating a light emitting characteristic of a conventional AC light-emitting device, and a solid line (b) is a curve schematically illustrating a light emitting characteristic of a light emitting device according to the embodiment of the present invention.

Referring to FIG. 20, the conventional light emitting device that does not employ a delay phosphor periodically repeats on-off by means of application of an AC voltage thereto. Assuming that the period of an AC power source is T, two arrays each of which has light emitting cells connected in series are alternately operated once during the period T. Thus, the light emitting device emits light with a period of T/2 as represented by the dotted line (a). Meanwhile, if the AC voltage does not exceed a threshold voltage of the light emitting cells connected in series, the light emitting cells are not operated. Thus, the light emitting cells remain in a turned-off state for a certain time, i.e., for a time during which the AC voltage is smaller than the threshold voltage thereof, between times during which the light emitting cells are operated. Accordingly, a flicker effect may appear in the conventional light emitting device due to gaps between times during which the light emitting cells are operated.

On the other hand, since the light emitting device according to the embodiment of the present invention employs a delay phosphor, light is emitted even while the light emitting cells remain in the turned-off state as represented by the solid line (b). Thus, although there is a change in luminous intensity, a time during which light is not emitted becomes shorter, and the light emitting device continuously emits light if the decay time of the delay phosphor is long.

When a general household AC power source applies a voltage with a frequency of about 60 Hz, one cycle of the power source is about 16.7 msec and a half cycle is 8 msec.

Thus, while the light emitting device is in operation, a time during which all the light emitting cells are turned off is smaller than 8 msec. Accordingly, if the decay time of the delay phosphor is 1 msec or more, a flicker effect can be sufficiently reduced. Particularly, if the decay time of the delay phosphor is similar to a time during which all the light emitting cells are turned off, the light emitting device can continuously emit light.

What is claimed is:

1. A light-emitting device, comprising:
a first power source connection terminal and a second power source connection terminal; and
a plurality of first arrays of GaN-based light emitting cells, each first array comprising a plurality of serially connected light emitting cells, the first arrays being connected in parallel to one another between the first power source connection terminal and the second power source connection terminal, and each first array being configured to emit light under a different voltage level from the other first arrays,
wherein the GaN-based light emitting cells are monolithically formed on a substrate, and
wherein an N-type semiconductor layer of one light emitting cell is electrically connected to a P-type semiconductor layer of an adjacent light emitting cell.

2. The light-emitting device of claim 1,
wherein the first arrays have different numbers of light emitting cells from each other.

3. The light-emitting device of claim 2, further comprising:
a plurality of first resistors connected in series to the first arrays,
wherein each first resistor is respectively connected to one of the first arrays.

4. The light-emitting device of claim 3,
wherein the first resistors have different resistance values from each other, and
the first resistors are respectively connected in series to the first arrays in such a manner that one of the first resistors comprising a larger resistance value relative to the other first resistors is connected to a first array comprising a smaller number of light emitting cells relative to the other first arrays, and one of the first resistors comprising a smaller resistance value relative to the other first resistors is connected to a first array comprising a larger number of light emitting cells relative to the other first arrays.

5. The light-emitting device of claim 1, further comprising:
a plurality of second arrays of light emitting cells, each second array comprising a plurality of serially connected light emitting cells, the second arrays being connected in reverse parallel to the first arrays.

6. The light-emitting device of claim 1, wherein the substrate consists of $Al_2O_3$ or SiC.

7. A light-emitting device, comprising:
a bridge rectifier; and
a plurality of light emitting cell arrays, each array comprising a plurality of serially connected GaN-based light emitting cells, the arrays being connected in parallel to one another between two nodes of the bridge rectifier, and each array is configured to emit light under a different voltage level from the other arrays,
wherein the GaN-based light emitting cells are monolithically formed on a substrate,
wherein the bridge rectifier comprises a bridge circuit in which at least one diode is disposed between a first node and a second node, at least one diode is disposed between the second node and a third node, at least one diode is disposed between the third node and a fourth node, and at least one diode is disposed between the fourth node and the first node of the bridge circuit, respectively, and wherein each diode comprises a light emitting cell.

8. The light-emitting device of claim 7, wherein each array comprises a different number of light emitting cells than the other arrays.

9. The light-emitting device of claim 8, further comprising:

a plurality of resistors connected in series to the arrays, wherein each resistor is respectively connected to one of the arrays.

10. The light-emitting device of claim 9, wherein the resistors have different resistance values from each other, and wherein the resistors are respectively connected in series to the arrays in such a manner that one of the resistors comprising a larger resistance value relative to the other resistors is connected to an array comprising a smaller number of light emitting cells relative to the other arrays, and one of the resistors with a smaller resistance value relative to the other resistors is connected to an array comprising a larger number of light emitting cells relative to the other arrays.

11. The light-emitting device of claim 7, wherein the bridge rectifier and the plurality of light emitting cell arrays are formed on a substrate.

12. The light-emitting device of claim 11, wherein the substrate consists of $Al_2O_3$ or SiC.

\* \* \* \* \*